United States Patent
Ogawa et al.

(10) Patent No.: US 7,941,730 B2
(45) Date of Patent: May 10, 2011

(54) MEMORY SYSTEM

(75) Inventors: Toshio Ogawa, Kawasaki (JP); Yoshihiro Takemae, Kawasaki (JP); Yoshinori Okajima, Kawasaki (JP); Tetsuhiko Endo, Kawasaki (JP); Yasuro Matsuzaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1363 days.

(21) Appl. No.: 11/443,031

(22) Filed: May 31, 2006

(65) Prior Publication Data

US 2007/0192527 A1    Aug. 16, 2007

(30) Foreign Application Priority Data

Feb. 16, 2006  (JP) .................. 2006-039851

(51) Int. Cl.
  *G06F 11/10* (2006.01)
  *G06F 13/14* (2006.01)
(52) U.S. Cl. ........................ 714/773; 711/147
(58) Field of Classification Search .................. 714/773; 711/147
  See application file for complete search history.

(56) References Cited

U.S. PATENT DOCUMENTS

| | | | | |
|---|---|---|---|---|
| 4,302,808 A * | 11/1981 | Zanchi et al. | ................. | 710/116 |
| 5,379,379 A * | 1/1995 | Becker et al. | .................... | 711/3 |
| 5,469,558 A * | 11/1995 | Lieberman et al. | ............ | 710/105 |
| 5,705,938 A * | 1/1998 | Kean | ................................ | 326/39 |
| 5,987,628 A * | 11/1999 | Von Bokern et al. | ........... | 714/48 |
| 6,556,952 B1 * | 4/2003 | Magro | ........................ | 702/183 |
| 6,678,838 B1 * | 1/2004 | Magro | ........................ | 714/42 |
| 6,751,698 B1 * | 6/2004 | Deneroff et al. | ................. | 710/317 |
| 7,098,685 B1 * | 8/2006 | Agrawal et al. | ................. | 326/38 |
| 7,305,535 B2 * | 12/2007 | Harari et al. | .................. | 711/164 |
| 7,493,437 B1 * | 2/2009 | Jones et al. | .................... | 710/301 |
| 7,512,726 B2 * | 3/2009 | Han et al. | ......................... | 710/62 |
| 7,673,080 B1 * | 3/2010 | Yu et al. | .......................... | 710/62 |
| 2005/0198424 A1 * | 9/2005 | Harari et al. | ................... | 710/301 |

FOREIGN PATENT DOCUMENTS

JP    11-205125    7/1999

* cited by examiner

*Primary Examiner* — Stephen M Baker

(74) *Attorney, Agent, or Firm* — Arent Fox LLP

(57) ABSTRACT

A semiconductor memory has a field programmable unit in which logic to inter-convert external signals to be input/output to/from a memory system and internal signals to be input/output to/from a memory cell array is programmed. A program for constructing the logic of the field programmable unit is stored in a nonvolatile program memory unit. Through the field programmable unit, a controller can access the memory cell array, even when the interface of the controller accessing the semiconductor memory is different from an interface for accessing the memory cell array. Therefore, one kind of semiconductor memory can be used as plural kinds of semiconductor memories. This eliminates the need to develop plural kinds of semiconductor memories, reducing a development cost.

12 Claims, 24 Drawing Sheets

MEMORY SYSTEM

CROSS REFERENCE TO RELATED APPLICATION

This application is based upon and claims the benefit of priority from Japanese Patent Application No. 2006-039851, filed on Feb. 16, 2006, the entire contents of which are incorporated herein by reference.

BACKGROUND OF THE INVENTION

1. Field of the Invention

The present invention relates to a memory system which has a field programmable unit.

2. Description of the Related Art

In order to make changeable logic for implementing a predetermined circuit function through a program, a logic device has been proposed which has a field programmable unit. This kind of logic device is used together with a program memory unit which stores a program for constructing logic.

Also, a programmable circuit has been proposed which has a program memory unit composed of a field programmable unit and semiconductor memory (for example, see Japanese Unexamined Patent Application Publication No. 11-205125). The semiconductor memory stores a program for constructing the logic of the field programmable unit during the non-operation of the programmable circuit. The program stored in the semiconductor memory is transmitted to the field programmable unit so as to construct the logic of the field programmable unit. When the programmable circuit operates, that is, after the program is transmitted to the field programmable unit, the semiconductor memory is used as a random access memory. This accordingly eliminates the need for a dedicated memory to store the program. The field programmable unit in which the logic has been constructed performs an image compression processing, for example.

However, in the conventional memory system having the field programmable unit and the semiconductor memory, the operation specification of the semiconductor memory is fixed and is not changable by the logic of the field programmable unit.

SUMMARY OF THE INVENTION

Accordingly, it is an object of the present invention to implement various kinds of memory functions through one semiconductor memory and reduce a development cost of semiconductor memory.

According to an aspect of the invention, a semiconductor memory has a field programmable unit in which logic to inter-convert external signals and internal signals is programmed. The external signals are input/output to/from a memory system, and the internal signals are input/output to/from a memory cell array. A program for constructing the logic of the field programmable unit is stored in a nonvolatile program memory unit. Even when the interface of a controller accessing the semiconductor memory is different from an interface accessing the memory cell array, the field programmable unit allows the controller to access the memory cell array. The logic of the field programmable unit can be changed in accordance with a program. That is, the specification of the converted portion of interface can be changed in accordance with the controller connected to the semiconductor memory. Accordingly, one kind of semiconductor memory can be used as plural kinds of semiconductor memories. As a result, there is no need to develop plural kinds of semiconductor memories, enabling reduction of a development cost.

According to a preferable example of the aspect of the invention, the internal signals include an internal address signal which indicates a memory cell to be accessed, and an internal data signal which is written into the memory cell. The logic programmed in the field programmable unit has a signal switch unit which outputs the external signals to the memory cell array as the internal address signal and internal data signal. Because of this, it is possible to change the address space indicated by the address signal and the bit width of the data signal read from and written into the memory cell array, in accordance with a program. In other words, plural kinds of semiconductor memories which have different bit widths of a data signal can be implemented by one kind of semiconductor memory. As a result, it is possible to reduce a development cost of a semiconductor memory.

According to a preferable example of the aspect of the invention, the logic programmed in the field programmable unit has a command conversion unit. The command conversion unit converts an external command signal indicating an access request for accessing the memory cell array into an internal command signal for accessing the memory cell array. Accordingly, the semiconductor memory can be accessed by controllers accessing different kinds of semiconductor memories having different command systems from each other. That is, plural kinds of semiconductor memories can be implemented by one kind of semiconductor memory. As a result, it is possible to reduce a development cost of a semiconductor memory.

According to a preferable example of the aspect of the invention, the logic programmed in the field programmable unit has a command conversion unit and an arbiter. The command conversion unit converts, into internal command signals for accessing the memory cell array, each of the external command signals indicating access requests for the memory cell array which are supplied from a plurality of controllers. The arbiter determines an order in which the command conversion unit outputs the internal command signals in response to the external command signals, when the external command signals compete with each other. As a result, the memory system can execute an access operation without malfunctioning, even when the plurality of controllers is connected. Therefore, it is possible to construct a memory system which has a common semiconductor memory accessed by a plurality of controllers.

According to a preferable example of the aspect of the invention, a plurality of external terminals through which external signals are input and output are connected to a plurality of controllers having error correction code systems for data signal different from each other. The error code area formed in the memory cell array stores a main error correction code corresponding to the main controller among the controllers. The logic programmed in the field programmable unit has an error code conversion unit. The error code conversion unit converts, into the main error correction code, a sub error correction code which is supplied from the sub controller among the controllers through the external terminal together with the data signal, and writes the main error correction code into the error code area. Accordingly, one semiconductor memory can be shared by the plurality of controllers having different error correction code systems from each other. Therefore, the number of semiconductor memories within the system can be decreased, reducing a system cost.

According to a preferable example of the aspect of the invention, the error code conversion unit converts, into the a sub error correction code, the main error correction code which is read from the memory cell array together with the data signal in accordance with the read access request from the sub controller. Then, the error code conversion unit outputs the sub error correction code to the sub controller through the external terminal. Accordingly, the sub controller can access the semiconductor memory without recognizing that the interface is different. That is, one semiconductor memory can be shared by the plurality of controllers having different error correction code systems from each other.

According to a preferable example of the aspect of the invention, the error code conversion unit has a function of detecting and correcting an error in the data signal from the error correction code supplied from the controller through the external terminal in accordance with a write access request. Further, the error code conversion unit writes the error-corrected data signal and the main error correction code corresponding to the error-corrected data signal into the memory cell array. Accordingly, it is possible to detect and correct an error occurring between the controller and the memory system. Therefore, the reliability of the system on which the memory system is mounted can be enhanced.

According to a preferable example of the aspect of the invention, the logic programmed in the field programmable unit has a memory patrol unit. While the memory cell array is not accessed, the memory patrol unit reads a data signal and a main error correction code corresponding to the data signal from the memory cell array, corrects an error in the read data signal, and rewrites the corrected data signal and the main error correction code into the memory cell array. Accordingly, in the semiconductor memory shared by the plurality of controllers having different error correction code systems from each other, the data destroyed by softerror, noise or the like can be automatically recovered. As a result, it is possible to enhance the reliability of the semiconductor memory.

According to a preferable example of the aspect of the invention, the memory cell array is partitioned into a plurality of memory areas. The logic programmed in the field programmable unit has a function of setting access rights to the memory areas to each of the controllers. This makes it possible to provide a semiconductor memory having various access areas and access rights in accordance with the specification of a system, by just developing one kind of semiconductor memory.

According to a preferable example of the aspect of the invention, the memory cell array is composed of a nonvolatile memory cell. The program memory unit is formed by using a portion of the memory cell array. This eliminates the need to form an independent program memory unit by storing a program for constructing the logic of the field programmable unit in the portion of the memory cell array. As a result, it is possible to simplify the construction of the memory system and to reduce a system cost.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
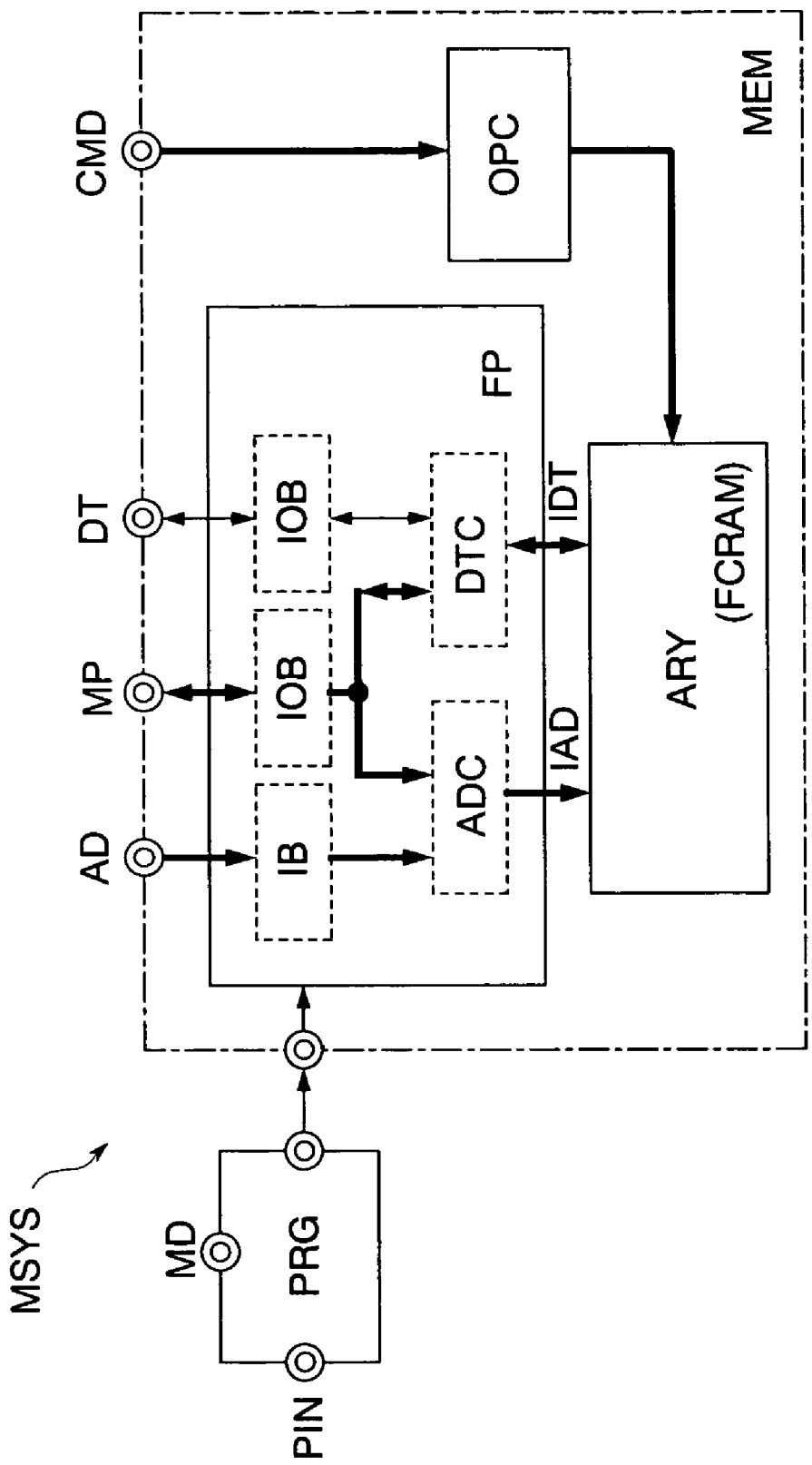
FIG. 1 is a block diagram showing a first embodiment of the present invention.

Hereinafter, preferred embodiments of the present invention will be described with reference to the drawings. A double circle in the drawings represents an external terminal receiving external signals. A signal line indicated by heavy line is composed of a plurality of lines. Some of blocks to which the heavy lines are connected are composed of a plurality of circuits. In the signal line, to which a signal is transmitted, the same reference numeral as the name of the signal is used.

FIG. 1 shows a memory system MSYS according to a first embodiment of memory system of the present invention. The memory system MSYS includes a semiconductor memory MEM and a program memory unit PRG. The semiconductor memory MEM and the program memory unit PRG are respectively formed of a semiconductor chip. The semiconductor memory MEM includes a field programmable unit FP, a memory cell array ARY, and an operation control unit OPC. For example, the semiconductor memory MEM has a memory cell of DRAM (dynamic memory cell) and is formed of a FCRAM (fast cycle RAM) having an interface of SRAM. The FCRAM, which is a kind of pseudo SRAM, regularly executes a refresh operation inside the chip without receiving a refresh command from the outside and holds the data written into the memory cell.

The field programmable unit FP is composed of multiple logic elements and multiple switching elements for connecting the logic elements. The switching element is formed by using a volatile memory cell. The switching element of the field programmable unit FP is programmed in accordance with a program which is loaded from the program memory unit PRG. By the program, a predetermined hardware function is implemented.

In the present embodiment, an input buffer IB receiving an address signal AD, an input/output buffer IOB receiving a multipurpose signal MP, an input/output buffer IOB receiving a data signal DT, an address converting unit ADC, and a data conversion unit DTC are formed in the field programmable unit FP by the program. Further, in accordance with the program, the number of bits of a data signal line IDT and the number of bits of an address signal line IAD are set. The data signal line IDT and the address signal line IAD are connected to the memory cell array ARY. That is, it is possible to implement the semiconductor memory MEM which can change the bit width and address space of data.

Although not shown in the drawing, the field programmable unit FP includes a portion of the logic of a data input/output circuit and address decoder to which the data signal line IDT and the address signal line IAD are connected. Further, by changing the logic of those circuits in accordance with the number of bits of the data signal line DT and the number of bits of the address signal line AD, the bit width of a data signal DT and the address space which can be accessed by an address signal AD are set.

In accordance with a program, a multipurpose terminal MP functions as any one of an address terminal AD, a data terminal DT, and an unused terminal. When the multipurpose terminal MP is used as the address terminal AD, the input/output buffer IOB connected to the multipurpose terminal MP disables an output function of signal. The address converting unit ADC selects an address signal, which is supplied from the multipurpose terminal MP, and supplies to the memory cell array ARY the selected address signal and the address signal AD (external address signal) supplied through the address terminal AD as an internal address signal IAD. A data conversion unit DTC selects a data signal, which is supplied from the multipurpose terminal MP, and outputs to the memory cell array ARY the selected data signal and the data signal DT supplied through the data terminal DT as an internal data signal IDT. As such, the address converting unit ADC and the data conversion unit DTC operate as a signal switch unit which outputs to the memory cell array ARY the external signals AD, MP, and DT as the internal address signal IAD or internal data signal IDT.

The program memory unit PRG is composed of a nonvolatile semiconductor memory such as EEPROM, flash memory or the like. The program memory unit PRG stores a program which is supplied from the outside through a program input terminal PIN. In this example, the program memory unit PRG can store two kinds of programs. For example, the program memory unit PRG outputs one of programs stored therein to the field programmable unit FP, in accordance with the logic level of the mode signal MD which is supplied from the outside through the mode terminal MD. The transmission of program into the field programmable unit FP is carried out through a standardized dedicated port such as JTAG (joint test action group) or $I^2C$ (inter integrated circuit).

For example, when a system on which the memory system MSYS is mounted is powered on, the mode signal MD is supplied by the system. The mode signal MD is the uppermost bit of an address signal for accessing the program memory unit PRG. A program is written into the program memory unit PRG by a maker who manufactures the memory MEM.

An operation control circuit OPC decodes a command signal CMD (external access request), which is supplied from the outside of the memory MEM through a command terminal CMD, so as to output an access signal for accessing the memory cell array ARY.

The memory cell array ARY has an address decoder, a word line, a bit line, and a sense amplifier for accessing a memory cell. The memory cell array ARY executes a read or write operation in accordance with an access signal.

The operation control circuit OPC periodically outputs an access signal (internal access request) for refreshing memory cells. For this reason, the operation control circuit OPC has a refresh timer generating an internal refresh request, a refresh address generator, and an arbiter, which are not shown. The arbiter determines a priority order of access operation with respect to an external access request and internal access request. When a refresh operation is executed, the refresh address signal from the refresh address generator is supplied to the memory cell array ARY instead of the external address signal AD.

Figure 2:
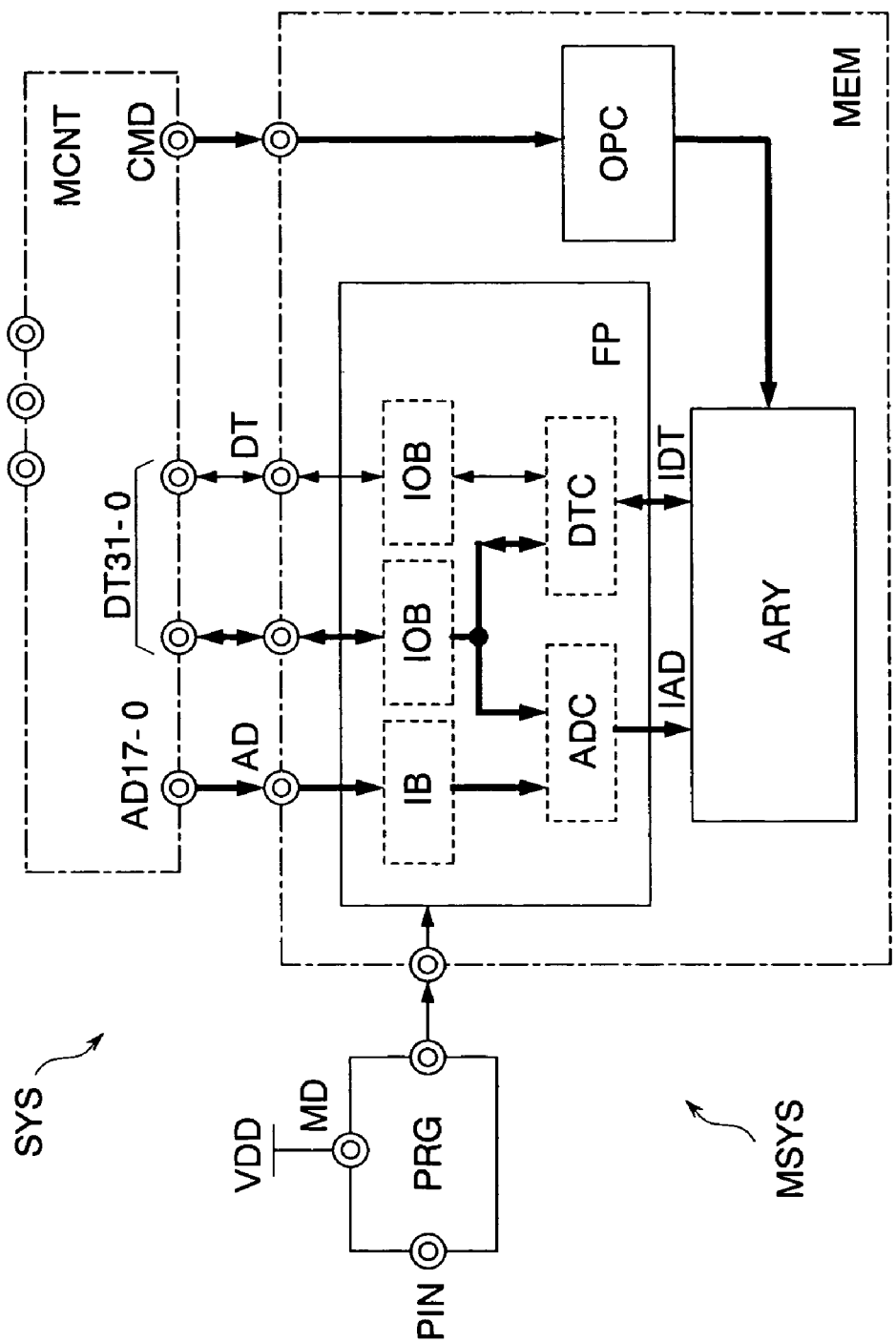
FIG. 2 is a block diagram showing an example where the memory shown in FIG. 1 is used.

FIG. 2 shows an example where the memory system MSYS shown in FIG. 1 is used. In this example, a system SYS is composed of the memory system MSYS and a memory controller MCNT (chip) which accesses the memory MEM. The system SYS has the memory MEM, the program memory unit PRG, and the memory controller MCNT, which are mounted on a system board, so as to be constructed as a SIP (system in package). Moreover, the memory MEM, the program memory unit PRG, and the memory controller MCNT may be layered and the terminals may be directly connected without a system board, thereby forming the SIP.

The memory controller MCNT outputs a 18-bit address signal AD17-0 and a command signal CMD for accessing the memory MEM, and inputs and outputs a 32-bit data signal DT31-0. The memory controller MCNT has an external terminal connected to an upper controller.

The mode terminal MD of the program memory unit PRG is connected to a power supply line VDD. When the system SYS is powered on, the program memory unit PRG transmits to the field programmable unit FP a program for composing a memory MEM having an address space of 256 k word and a data width of 32 bits, in accordance with the mode signal MD with a high logic level. Moreover, when it is likely that the program is changed after the shipment of the memory MEM, the program input terminal PIN may be connected to the system SYS. In this case, the program can be updated on the system SYS.

In the field programmable unit FP, the input/output buffer IOB connected to the multipurpose terminal MP is used for inputting and outputting data signals DT31 to DT1.

The address converting unit ADC outputs only the address signal AD, which is received by the address terminal AD, to the memory cell array ARY. The address converting unit ADC does not receive a signal from the multipurpose terminal MP. The data conversion unit DTC inputs and outputs the data signal DT31-0, which is input and output to the data terminal DT and multipurpose terminal MP, to the memory cell array ARY. Further, the memory MEM having an address space of 256 k word and a data width of 32 bits is constructed.

Figure 3:
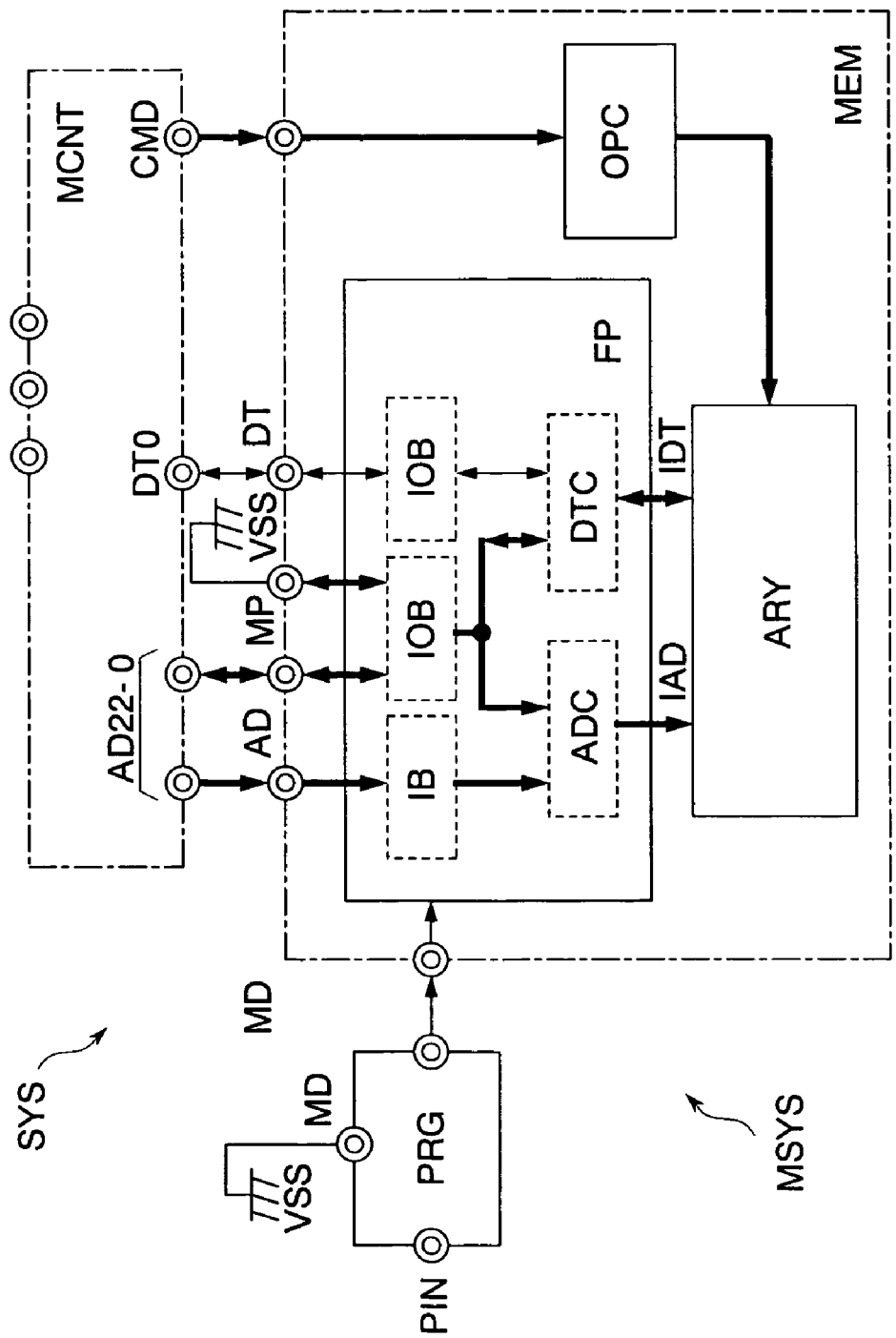
FIG. 3 is a block diagram showing another example where the memory shown in FIG. 1 is used.

FIG. 3 shows another example where the memory system MSYS shown in FIG. 1 is used. Similar to FIG. 2, the system SYS (SIP) is composed of the memory system MSYS and the memory controller MCNT accessing the memory MEM. In this example, the memory controller MCNT outputs a 23-bit address signal AD22-0 and a command signal CMD for accessing the memory MEM, and inputs and outputs a one-bit data signal DTO.

The mode terminal MD of the program memory unit PRG is connected to a ground line VSS. The program memory unit PRG transmits to the field programmable unit FP a program for constructing a memory MEM having an address space of 8 M word and a data width of one bit, in accordance with the mode signal MD with a low logic level when the system SYS is powered on. Moreover, in order to update the program on the system SYS, the program input terminal PIN may be connected to the system SYS.

In the field programmable unit FP, a portion of the input/output buffer IOB connected to the multipurpose terminal MP is used for receiving the address signal AD18-22. The remaining portion of the input/output buffer IOB is connected to the ground line VSS, because it is not used. The address converting unit ADC outputs to the memory cell array ARY the address signal AD received by the address terminal AD and the multipurpose terminal MP. The data conversion unit DTC inputs and outputs the data signal DTO, which is input and output to the data terminal DT, to the memory cell array ARY. Further, a memory MEM having an address space of 8 M word and a data width of one bit is constructed.

In the first embodiment, the system SYS can access the memory cell array ARY through the field programmable unit FP, even when the interface of the system SYS is different from the interface of the memory cell array ARY. The specification (logic which is programmed in the field programmable unit) of a portion which converts an interface can be freely changed according to the memory controller MCNT connected to the semiconductor memory MEM or the system SYS. Therefore, one kind of semiconductor memory MEM can be used as plural kinds of semiconductor memories. As a result, plural kinds of semiconductor memories do not need to be developed, and a development cost can be reduced.

Figure 4:
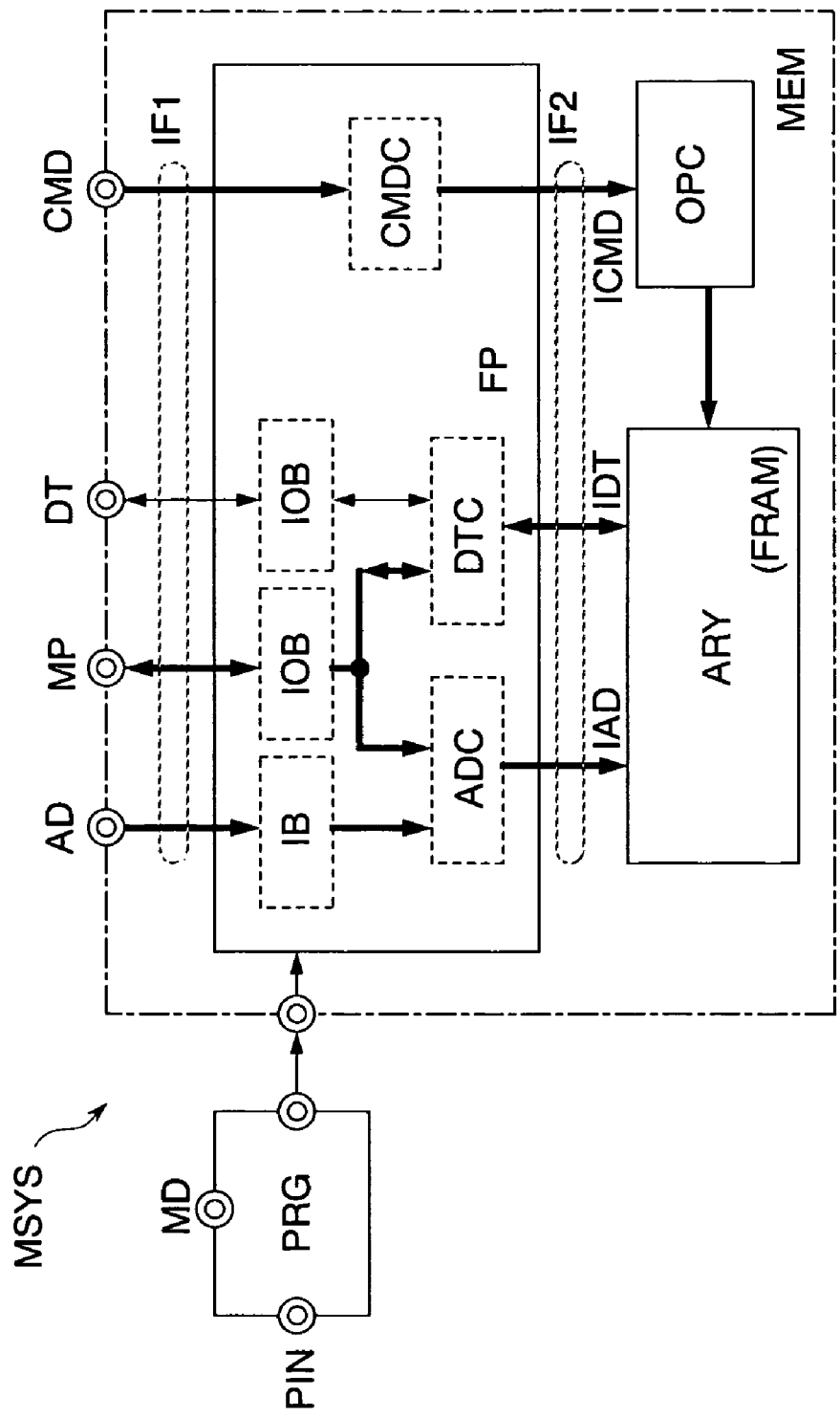
FIG. 4 is a block diagram showing a second embodiment of the invention.

FIG. 4 shows a second embodiment of memory system of the present invention. Like reference numerals are attached to the same components as those described in the first embodiment, and the descriptions thereof will be omitted. In the present embodiment, a function provided in the field programmable unit FP is different from that of the first embodiment. Further, the semiconductor memory MEM has a memory cell array ARY of FRAM (ferroelectric memory) and an operation control circuit OPC for accessing the memory cell array ARY. The signal, which is transmitted among the FRAM, the operation control circuit OPC, and the field programmable unit FP, has an interface specification IF2 for accessing the FRAM.

The program memory unit PRG has the mode terminal MD and the program input terminal PIN. The mode terminal MD is configured by two bits, for example. Therefore, the program memory unit PRG can store four kinds of programs, and the field programmable unit FP can be programmed into any one of four interface specifications.

The semiconductor memory MEM has the address terminal AD connected to a memory controller or CPU, the multipurpose terminal MP, the data terminal DT, and the command terminal CMD. The use of the multipurpose terminal MP is the same as that of the first embodiment. Therefore, the address space and the bit width of the data signal DT can be changed in accordance with the program stored in the program memory unit PRG. The interface specification IF1 of the signal which is supplied to the terminals AD, MP, DT, and CMD is an interface specification of a memory controller or CPU connected to the memory MEM. That is, in the present embodiment, multiple kinds of interface specifications IF1 are converted into the interface IF2 of FRAM by the field programmable unit FP.

For example, the interface specification IF1 is set to any one of interfaces of DRAM, NAND-type flash memory, SRAM, and FRAM. The memory MEM operates as any one of DRAM, NAND-type flash memory, SRAM, and FRAM, in accordance with the logic which is programmed in the field programmable unit FP.

The programmed field programmable unit FP has the address converting unit ADC, the data conversion unit DTC, and a command conversion unit CMDC, in addition to the input buffer IB and input/output buffer IOB. The address converting unit ADC changes the interface specification of the external address signal AD to output as an internal address signal IAD. The data conversion unit DTC changes the interface specification of the external data signal DT to output and input as an internal data signal IDT.

The command conversion unit CMDC changes the interface specification of the external command signal CMD (read request signal, write request signal, or delete request signal) to output as an internal command signal ICMD. The input buffer IB and the input/output buffer IOB have a function of changing an electrical specification (input voltage, output voltage or the like) according to the set interface. Moreover, when an interface of NAND-type flash memory is set in the field programmable unit FP, the address terminal AD is not used. In this case, the address signal as well as the access command CMD is supplied to the data terminal DT.

Even in the second embodiment, it is possible to obtain the same effect as that of the first embodiment. Further, it is possible to operate one semiconductor memory MEM as plural kinds of memories of which the command systems are different from each other. That is, it is possible to construct a multipurpose memory. As a result, a development cost and manufacturing cost of semiconductor memory can be significantly reduced.

Figure 5:
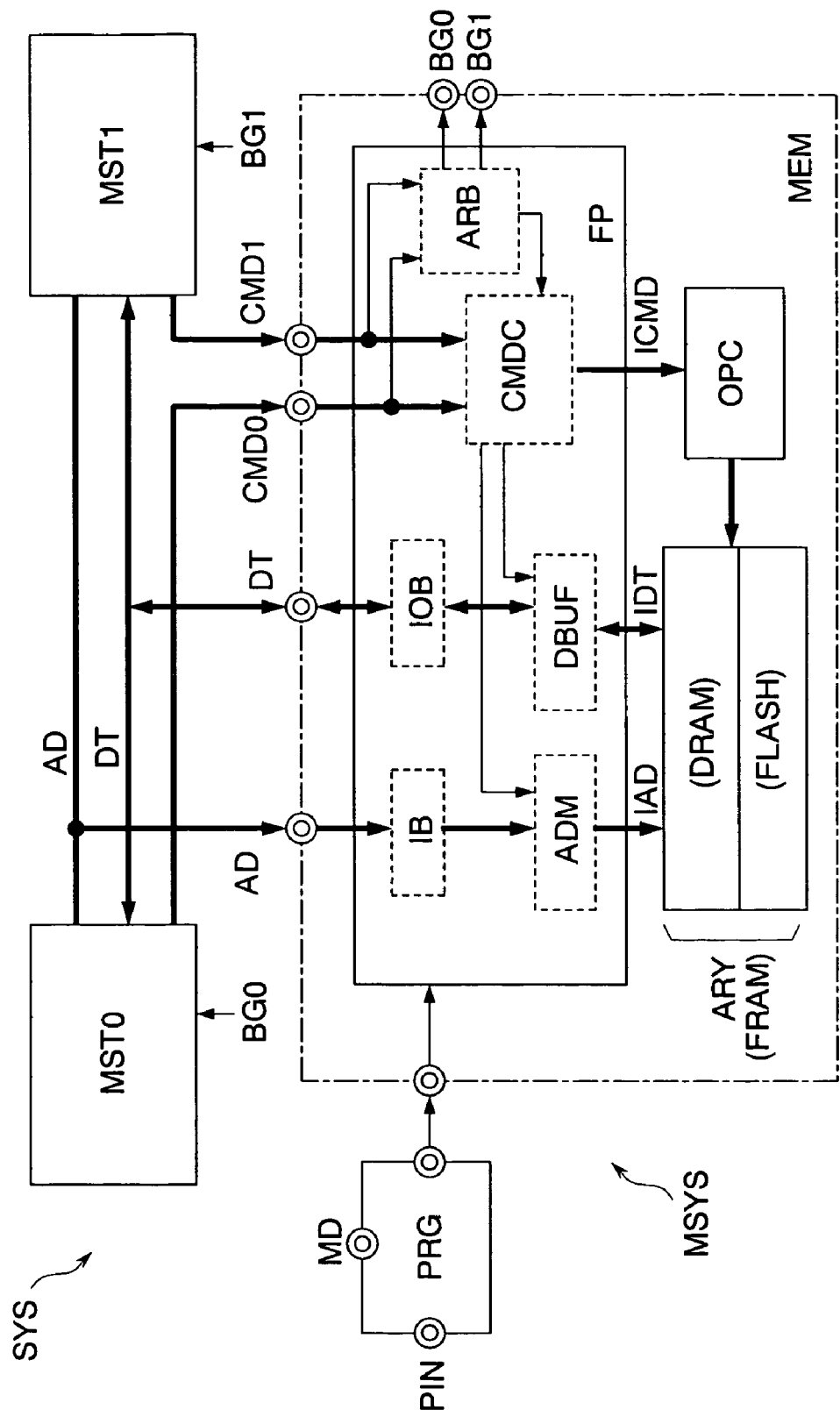
FIG. 5 is a block diagram showing a third embodiment of the invention.

FIG. 5 shows a third embodiment of memory system of the present invention. Like reference numerals are attached to the same components as those described in the first embodiment, and the detailed descriptions thereof will be omitted. In the present embodiment, master controllers MST0 and MST1 (for example, CPU) are connected to the memory system MSYS having the semiconductor memory MEM and the program memory unit PRG, so that the system SYS (SIP) is formed.

The memory MEM has the memory cell array ARY of FRAM (ferroelectric memory).

The memory MEM, which is accessed by a plurality of masters MST0 and MST1, has address terminals AD and the data terminals DT common to the masters MST0 and MST1, command terminals CMD0 and CMD1 respectively corresponding to the masters MST0 and MST1, and bus grant terminals BG0 and BG 1.

The master MST0 accesses the memory cell array ARY as DRAM. The master MST1 accesses the memory cell array ARY as NOR-type flash memory (FLASH). For this reason, the programmed field programmable unit FP has a function of converting a DRAM interface and FLASH interface into an FRAM interface.

The programmed field programmable unit FP has an input buffer IB, an input/output buffer IOB, an address management unit ADM, a data buffer DBUF, a command conversion unit CMDC, and an arbiter ARB. When receiving an access command CMD0 for DRAM from the master MST0, the field programmable unit FP converts the command CMD0 into an access command for FRAM. When receiving an access command CMD1 from the master MST1, the field programmable unit FP converts the command CMD1 into an access command for FRAM.

When the access commands CMD0 and CMD1 compete with each other, the arbiter ARB determines which of the commands is prioritized, in accordance with priority which is previously set. Then, the arbiter ARB transmits the commands to the command conversion unit CMDC. In the present embodiment, the master MST1 fetches the data stored in the memory cell array ARY as a program so as to operate. For this reason, the priority of the access command CMD1 is set high.

When the command conversion unit CMDC outputs an access command to the operation control circuit OPC, the arbiter ARB outputs a bus grant signal (any one of BG0 and BG1) to the master (any one of MST0 and MST1) which has supplied the access command. Moreover, the priority which is determined by the arbiter ARB can be easily changed by writing an update program into the program memory unit PRG through the program input terminal PIN. Particularly, with the program input terminal PIN being connected to the system SYS, the priority can be changed during operation of the system.

When outputting an access command to the operation control circuit OPC, the command conversion unit CMDC outputs a control signal to the address management unit ADM and the data buffer DBUF in synchronization with the access command. The address management unit ADM converts the received external address signal AD into an internal address signal IAD according to the accessed memory area (DRAM area or FLASH area). The data buffer DBUF inter-converts the input and output timing of the external data signal DT by the masters MST0 and MST1 and the input and output timing of the internal data signal IDT by the memory cell array ARY (FRAM).

The memory cell array ARY independently has an area accessed as DRAM and an area accessed as FLASH. For this reason, the memory MEM can be used instead of a conventional DRAM chip and FLASH chip. That is, semiconductor memories (DRAM and FLASH), which have been prepared for each of the masters MST0 and MST1 in the related art, can be substituted by one chip. Therefore, it is possible to reduce a system cost.

The program input terminal PIN and the program memory unit PRG are the same as those of the first embodiment, except that a loaded program is different. The program memory unit PRG stores one kind of program. The program memory unit PRG transmits the stored program to the field programmable unit FP, when the system SYS is powered on.

In the present embodiment, the multipurpose terminal MP of the first embodiment is not formed. However, with the multipurpose terminal MP being formed, it may be configured so that the address space of DRAM and NOR-type flash memory and the bit width of the data signal DT can be changed. Such a change can be easily carried out by connecting the program input terminal PIN to the system SYS.

Even in the third embodiment, it is possible to obtain the same effect as that of the first embodiment. Further, through the arbiter ARB, the memory system MSYS can execute an access operation without malfunctioning, even when the plurality of masters MST0 and MST1 are connected thereto. Therefore, it is possible to construct the memory system MSYS having the common semiconductor memory MEM which is accessed by the controller masters MST0 to MST1.

Figure 6:
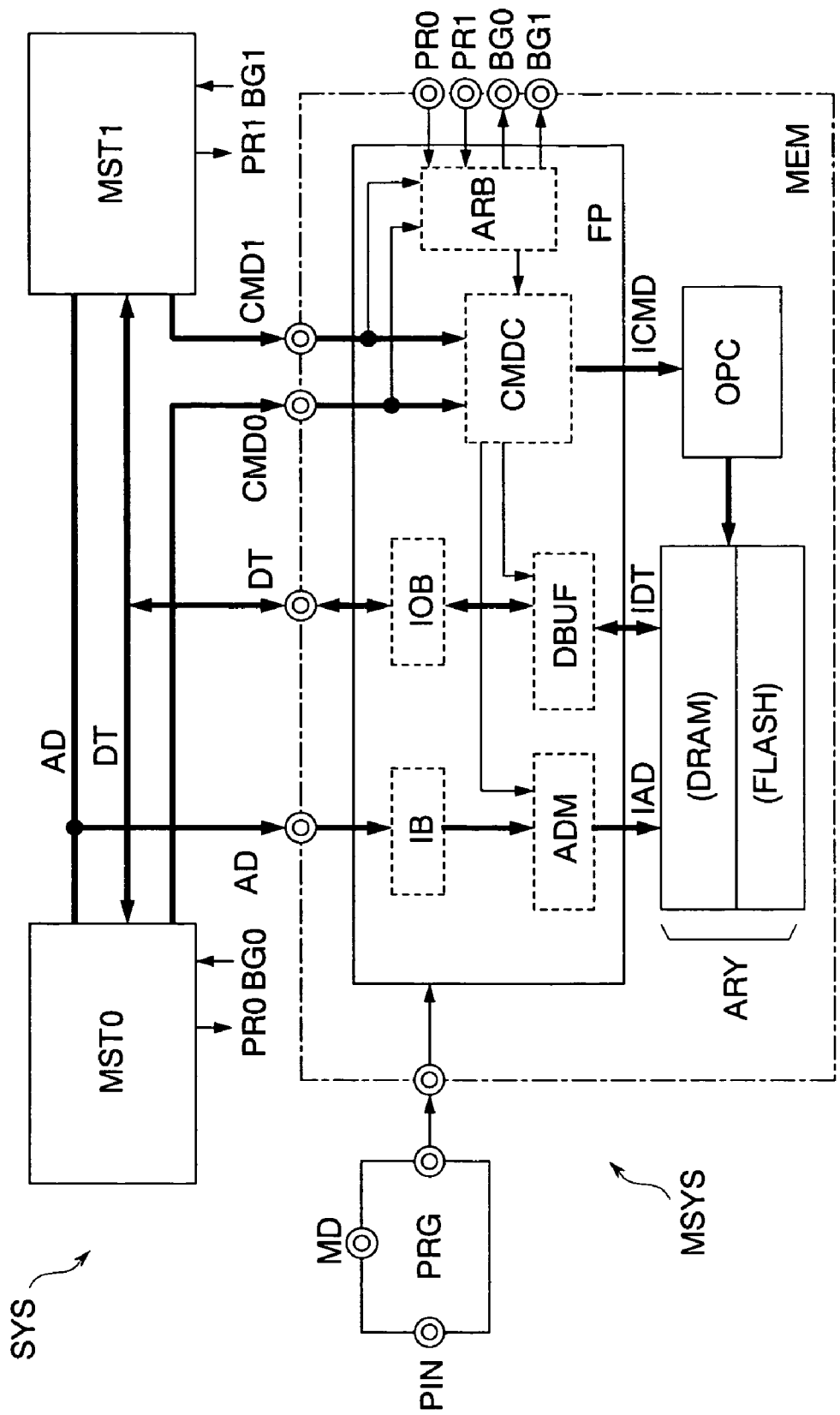
FIG. 6 is a block diagram showing a fourth embodiment of the invention.

FIG. 6 shows a fourth embodiment of memory system of the present invention. Like reference numerals are attached to the same components as those described in the first and third embodiments, and the detailed descriptions thereof will be omitted. In the present embodiment, the arbiter ARB receives priority signals PR0 and PR1 for changing access priority from the master controllers MST0 and MST1, respectively. The masters MST0 and MST1 output the priority signals PR0 and PR1, when the semiconductor memory MEM is desired to be preferentially accessed. When the priority signals PR0 and PR1 compete with each other, the priority signal PR1 is prioritized. The other constructions are the same as those of the third embodiment.

Even in the fourth embodiment, it is possible to obtain the same effect as those of the first and third embodiments. Further, the priority of the memory MEM can be temporarily changed by outputting the priority signals PR0 and PR1 to the arbiter ARB from the masters MST0 and MST1.

Figure 7:
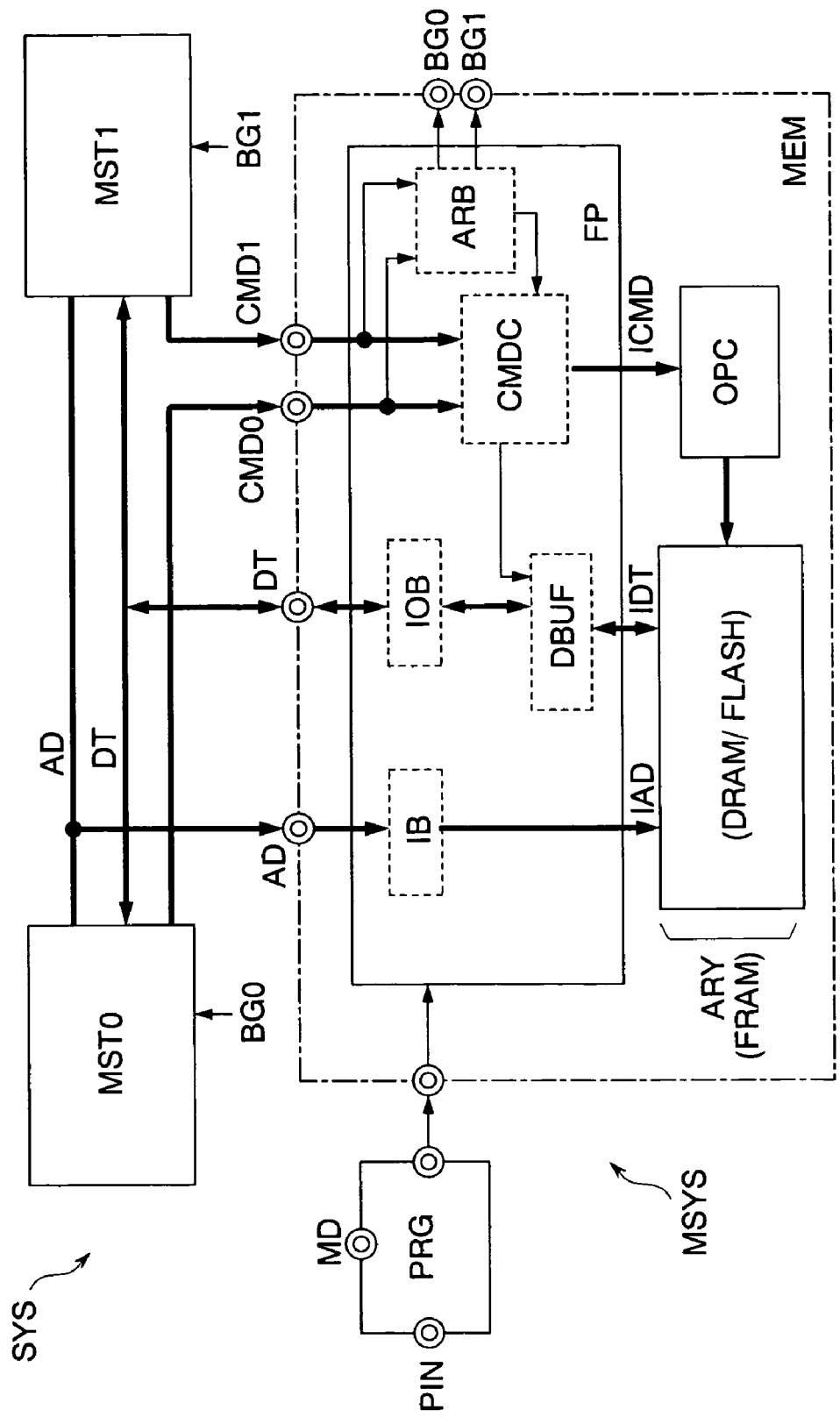
FIG. 7 is a block diagram showing a fifth embodiment of the invention.

FIG. 7 shows a fifth embodiment of memory system of the present invention. Like reference numerals are attached to the same components as those described in the first and third embodiments, and the detailed descriptions thereof will be omitted. In the present embodiment, the memory cell array ARY shares an area accessed as DRAM and an area accessed as FLASH. That is, an area which the master controller MST0 accesses as DRAM and an area which the master controller MST1 accesses as NOR-type flash memory are the same as each other. Since DRAM and FLASH are present in the common memory space, the address management unit ADM of the third embodiment is not needed. The other constructions are the same as those of the third embodiment. Even in the fifth embodiment, it is possible to obtain the same effect as those of the first and third embodiments.

Figure 8:
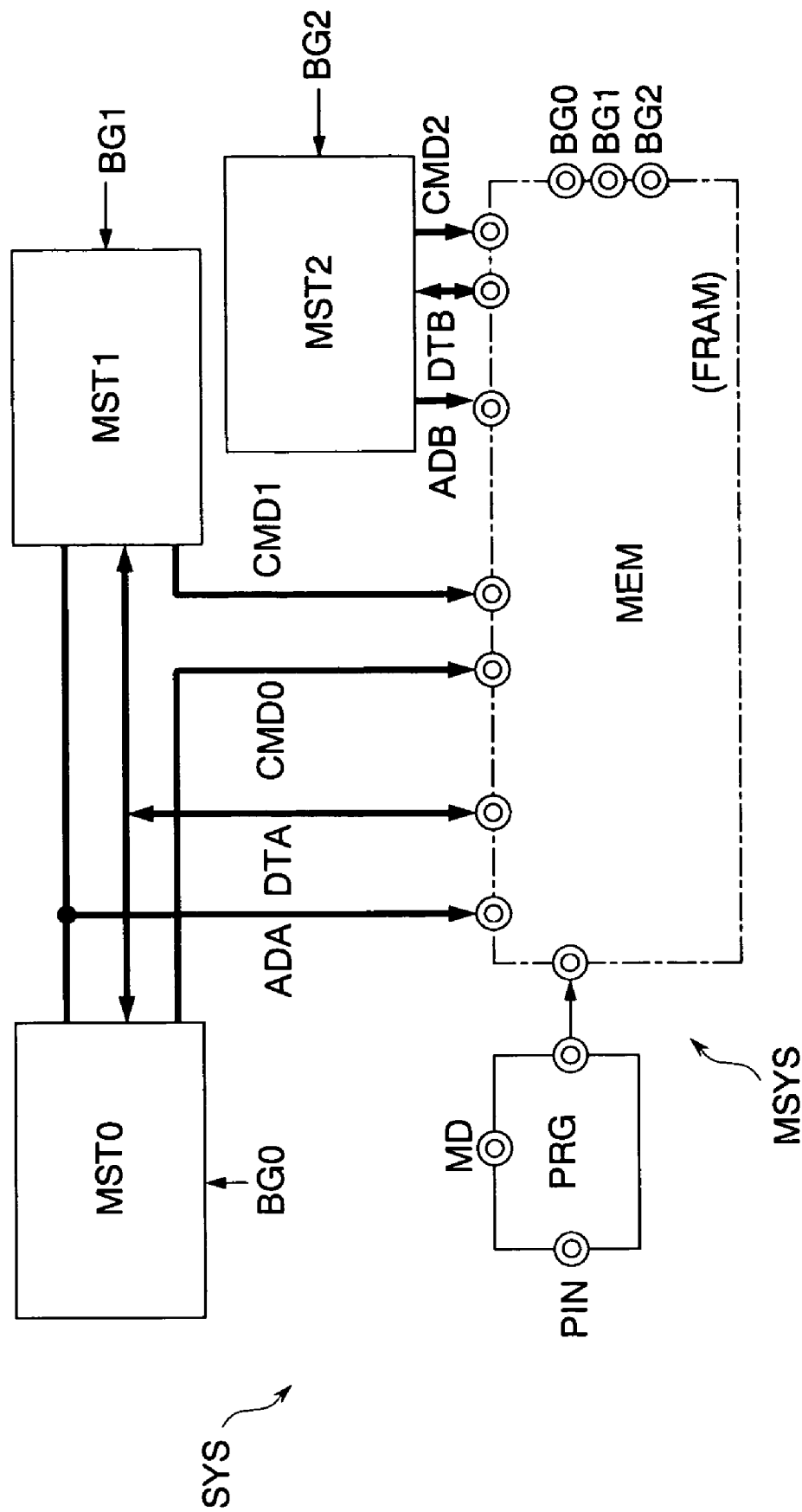
FIG. 8 is a block diagram showing a sixth embodiment of the invention.

FIG. 8 shows a sixth embodiment of memory system of the present invention. Like reference numerals are attached to the same components as those described in the first and third embodiments, and the detailed descriptions thereof will be omitted. The semiconductor memory MEM has a memory cell array ARY of FRAM (ferroelectric memory).

The memory MEM is accessed by three master controllers MST0 to MST2 (for example, CPU).

The masters MST0 and MST2 access the memory MEM as DRAM, and the master MST1 accesses the memory MEM as NOR-type flash memory. The specification where the masters MST0 and MST1 and the memory MEM are connected to each other is the same as that of the third embodiment. The masters MST0 and MST1 and the memory MEM are connected through a common address signal line ADA and a common data signal line DTA and independent command signal lines CMD0 and CMD1. The master MST2 and the memory MEM are connected through an independent address signal line ADB, data signal line DTB, and the command signal line CMD2.

Figure 9:
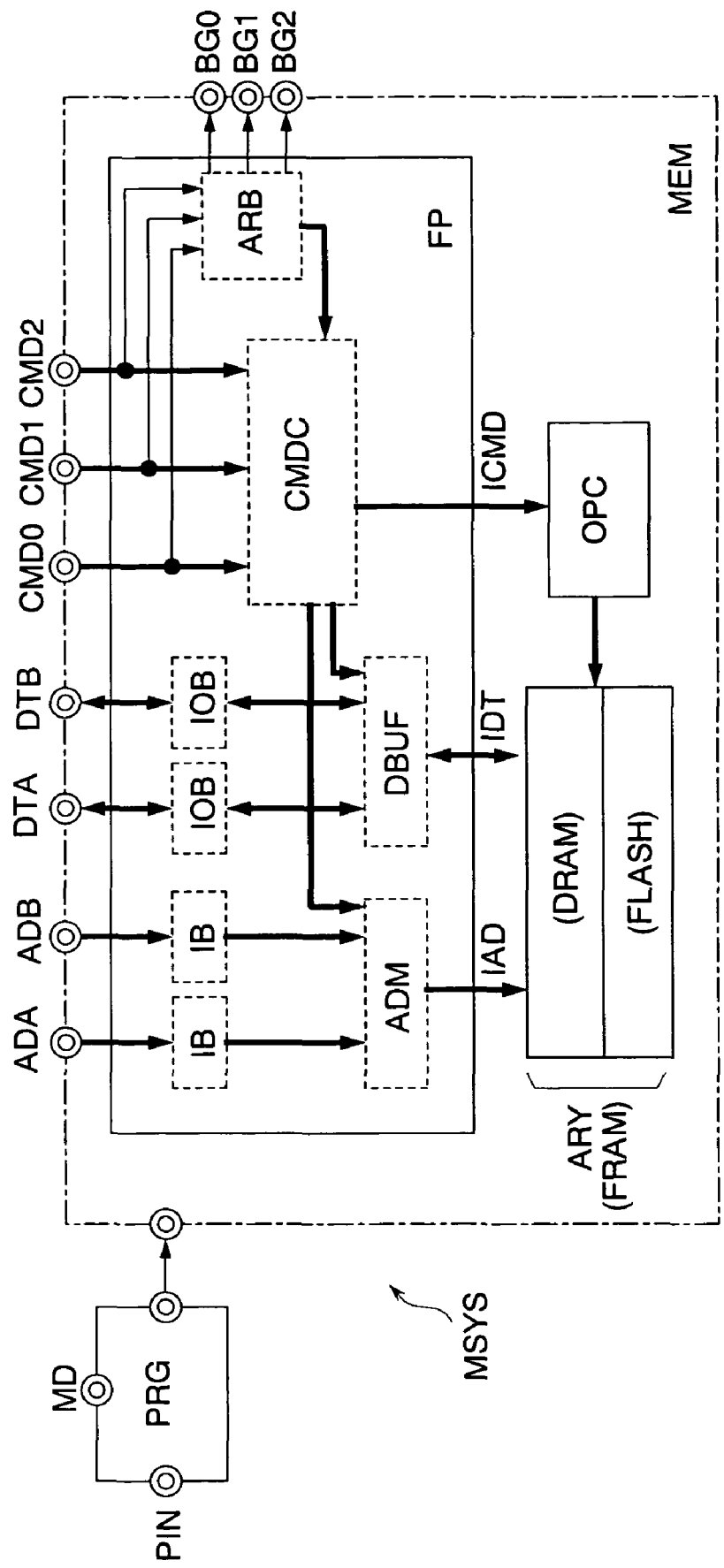
FIG. 9 is a block diagram showing details of the memory shown in FIG. 8.

FIG. 9 shows details of the memory MEM shown in FIG. 8. The basic functions of the address management unit ADM, the data buffer DBUF, the command conversion unit CMDC, and the arbiter ARB of the field programmable unit FP are the same as those of the third embodiment (FIG. 5). The address management unit ADM converts the received external address signal ADA into an internal address signal IAD according to a memory area (DRAM area or FLASH area) which is accessed. Further, the address management unit ADM converts the received external address signal ADB into an internal address signal IAD according to a DRAM area. The data buffer DBUF inter-converts the input and output timing of the external data signal DT by the masters MST0 and MST2 and the input and output timing of the internal data signal IDT by the memory cell array ARY.

When the command signals CMD0 to CMD2 compete with each other, the arbiter ARB transmits a priority order of access to the command conversion unit CMDC. Further, the arbiter ARB outputs the bus grant signals BG0 to BG2 to the masters MST0 to MST2 which has permitted the access. Moreover, the priority which is determined by the arbiter ARB can be easily changed by updating the program memory unit PRG through the program input terminal PIN. The command conversion unit CMDC responds to the command signals CMD0 to CMD2 so as to output a control signal to the address management unit ADM and the data buffer DBUF.

The above-described construction can avoid the competition of access, even when the bus lines (for example, ADA and ADB) connected to the memory MEM are independently wired. Further, the memory cell array ARY can be accessed as DRAM or FLASH. Even in the sixth embodiment, it is possible to obtain the same effect as those of the first and third embodiments.

Figure 10:
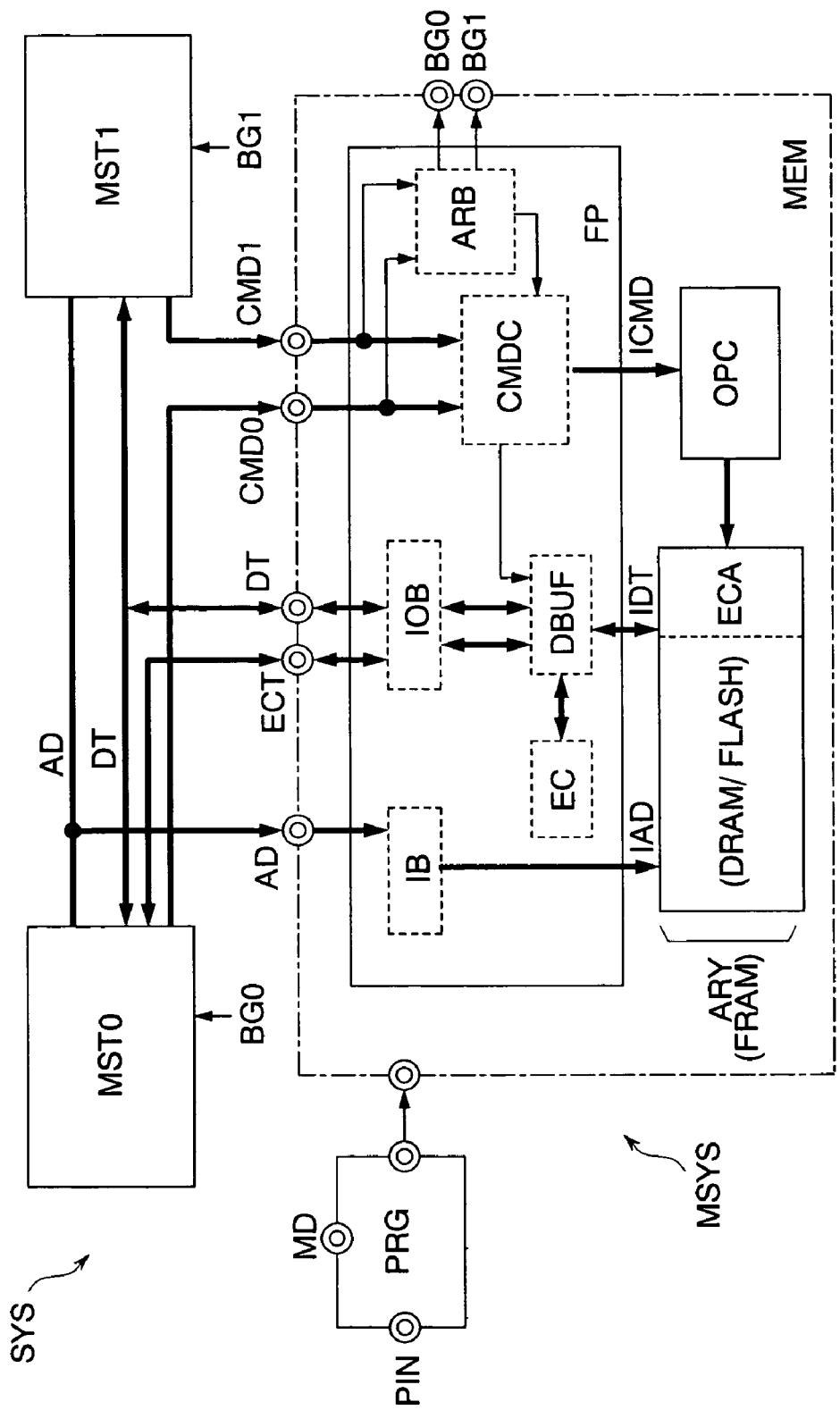
FIG. 10 is a block diagram showing a seventh embodiment of the invention.

FIG. 10 shows a seventh embodiment of memory system of the present invention. Like reference numerals are attached to the same components as those described in the first, third, and fifth embodiments, and the detailed descriptions thereof will be omitted. In the present embodiment, the master controller MST0 (main controller) accesses the semiconductor memory MEM as DRAM. The master controller MST1 (sub controller) accesses the semiconductor memory MEM as NAND-type flash memory FLASH.

The memory MEM has a memory cell array ARY of FRAM which shares an area accessed as DRAM and an area accessed as FLASH. The memory cell array ARY has an error code area ECA for storing an error correction code (main error correction code) for DRAM. The field programmable unit FP is constructed by adding an error code conversion unit EC to the field programmable unit FP of the fifth embodiment. The memory MEM has an error code terminal ECT for inputting and outputting an error correction code for DRAM to the master controller MST0. The other constructions are the same as those of the fifth embodiment.

In the present embodiment, the master MST1 accessing the memory MEM as FLASH outputs write data with an error correction code to the memory MEM on a write operation (program operation). For example, three-byte error correction code (sub error correction code) with respect to 512-byte write data is supplied to the memory MEM.

The error code conversion unit EC receives the write data and error correction code from the master MST1 through the data buffer DBUF. The error code conversion unit EC converts the error correction code into an error correction code for DRAM. Here, the error correction code for DRAM is a six-bit code for error-correcting 16-bit (two-byte) write data.

The error code conversion unit EC error-corrects the write data by using the converted error correction code for DRAM. The error code conversion unit EC generates a new error correction code when error-correcting. Accordingly, the error generated between the master MST1 and the memory MEM can be detected and corrected.

The 512-byte write data from the master MST1 and two-byte error correction code are written into the memory MEM as 512 write data and 512 error correction codes converted by the error code conversion unit EC. As such, in the present embodiment, the memory MEM is connected to the masters MST0 and MST1 of which the error correction code systems are different from each other.

In a read operation responding to the read access request from the master MST1, the error code conversion unit EC performs error correction by using the 512-byte data read from the memory MEM and 512 error correction codes. The error code conversion unit EC generates three-byte error correction codes for FLASH in accordance with the corrected read data. Further, the 512-byte read data and three-byte error correction code are output to the master MST1 through the data buffer DBUF.

In a write operation responding to the write access request from the master MST0, the error code conversion unit EC error-corrects the write data by using the write data (for example, two bytes) from the master MST0 and the error correction code (for example, six bits) for DRAM. Accordingly, the error generated between the master MST0 and the memory MEM can be detected and corrected. The corrected write data and the newly-generated error correction code are written into the memory cell array ARY. When there is no error, the write data received from the master MST0 and the error correction code are written into the memory cell array ARY as they are. Moreover, the error code conversion unit EC may receive only the write data from the master MST0 so as to generate an error correction code which is written into the memory cell array ARY by the error code conversion unit EC.

In a read operation responding to the read access request from the master MST0, the error code conversion unit EC error-corrects the read data, which is read from the memory cell array ARY, by using the error correction code which is read together with the read data. When there is no error, the read data and error correction code read from the memory cell array ARY are output into the master MST0. When there is an error, the corrected data and a newly-generated error correction code are output into the master MST0. At this time, the error code conversion unit EC may rewrite the corrected data and the newly-generated error correction code into the memory cell array ARY.

In general, when DRAM and FLASH are mounted on a system, the access speed of DRAM is emphasized in many cases. In the present invention, an error correction code for DRAM is written into the memory cell array ARY. For this reason, the error correction time corresponding to the read request (access request of DRAM) from the master MST0 can be minimized. Therefore, the read time of data can be prevented from being lengthened by the error correction.

Even in the seventh embodiment, it is possible to obtain the same effect as those of the first, third, and fifth embodiments. Further, with the error code conversion unit EC being formed in the field programmable unit FP, the memory cell array ARY can be shared by the plurality of masters MST0 and MST1 of which the error correction code systems are different from each other. Therefore, the number of semiconductor memories within the system SYS can be reduced, and a system cost can be reduced. Further, an error in the write data is detected and corrected by the error code conversion unit EC, so that the error generated between the masters MST0 and MST1 and the memory MEM can be detected and corrected. Therefore, it is possible to enhance the reliability of the system SYS.

Figure 11:
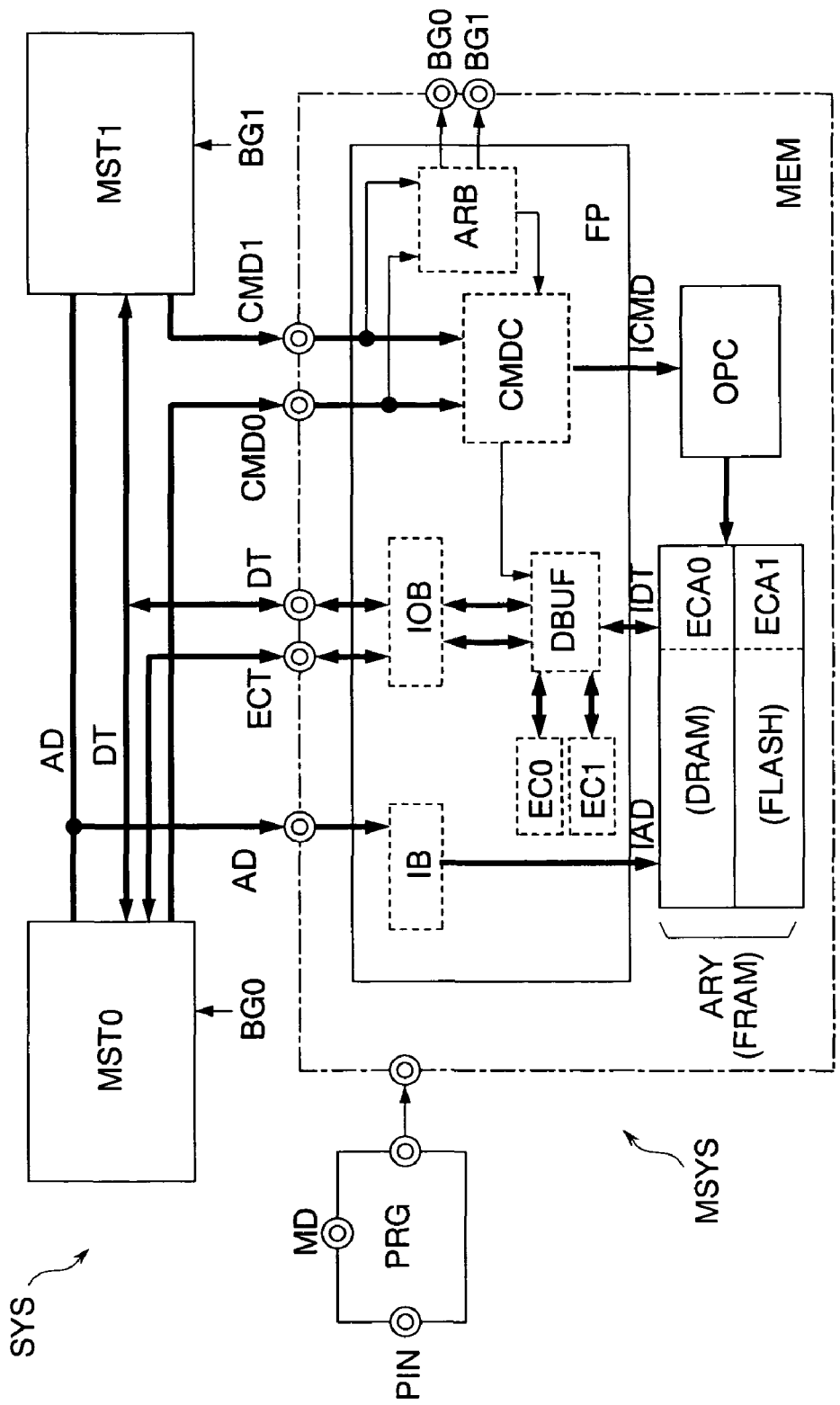
FIG. 11 is a block diagram showing an eighth embodiment of the invention.

FIG. 11 shows an eighth embodiment of memory system of the present invention. Like reference numerals are attached to the same components as those described in the first, third, fifth, and seventh embodiments, and the detailed descriptions thereof will be omitted. In the present embodiment, the memory cell array ARY independently has an area accessed as DRAM and an area accessed as NAND-type FLASH.

The DRAM area, which is accessed by the master controller MST0, has an area storing write data and an error code area ECA0 storing an error correction code of the write data. The FLASH area, which is accessed by the master controller MST1, has an area in which write data (program data) is stored and an error code area ECA1 in which an error correction code of the write data is stored. The DRAM is accessed in terms of 16 bits (six bits in the case of the error correction code), and the FLASH is accessed in terms of 512 bytes (three bytes in the case of the error correction code).

The programmed field programmable unit FP has an error code conversion unit EC0 for DRAM area which is accessed by the master MST0 and an error code conversion unit EC1 for FLASH area which is accessed by the master MST1. The other constructions of the field programmable unit FP are the same as those of the seventh embodiment (FIG. 10).

When the master MST0 performs a write operation, the error code conversion unit EC0 error-corrects the write data by using the write data (for example, two bytes) from the master MST0 and the error correction code (for example, six bits) for DRAM. Accordingly, the error generated between the master MST0 and the memory MEM can be detected and corrected. After that, the write data is written into the memory cell array ARY, and the error correction code is written into the error code area ECA0. Moreover, the error code conversion unit EC0 may receive only the write data from the master MST0 so as to generate an error correction code which is written into the memory cell array ARY by the error code conversion unit EC.

When the master MST0 performs a read operation, the error code conversion unit EC0 performs error correction by using the read data read from the memory cell array ARY and the error correction code read from the error code area ECA0 together with the read data. When there is no error, the read data read from the memory cell array ARY and the error correction code are output to the master MST0. When there is an error, the corrected data and a newly-generated error correction code are output to the master MST0. At this time, the error code conversion unit EC0 may rewrite the corrected data and the newly-generated error correction code to the memory cell array ARY.

When the master MST1 performs a write operation, the error code conversion unit EC1 error-corrects the write data by using an error correction code which is supplied together with the write data. When there is no error, the write data from the master MST1 is written into the memory cell array ARY, and the error correction code is written into the error code area ECA1. When there is an error, the corrected write data and a newly-generated error correction code are written into the memory cell array ARY.

When the master MST1 performs a read operation, the error code conversion unit EC1 performs error correction by using the read data read from the memory cell array ARY and the error correction code read from the error code area ECA1 together with the read data. When there is not error, the read data read from the memory cell array ARY and the error correction code read from the error code area ECA1 are output to the master MST1.

When there is an error, the corrected data and a newly-generated error correction code are output to the master MST1.

Even in the eighth embodiment, it is possible to obtain the same effect as those of the first, third, fifth, and seventh embodiments. Further, even when the error code areas ECA0 and ECA1 are respectively formed to correspond to the masters MST0 and MST1, the memory cell array ARY can be shared by the plurality of masters MST0 and MST1 of which the error correction code systems are different from each other.

Figure 12:
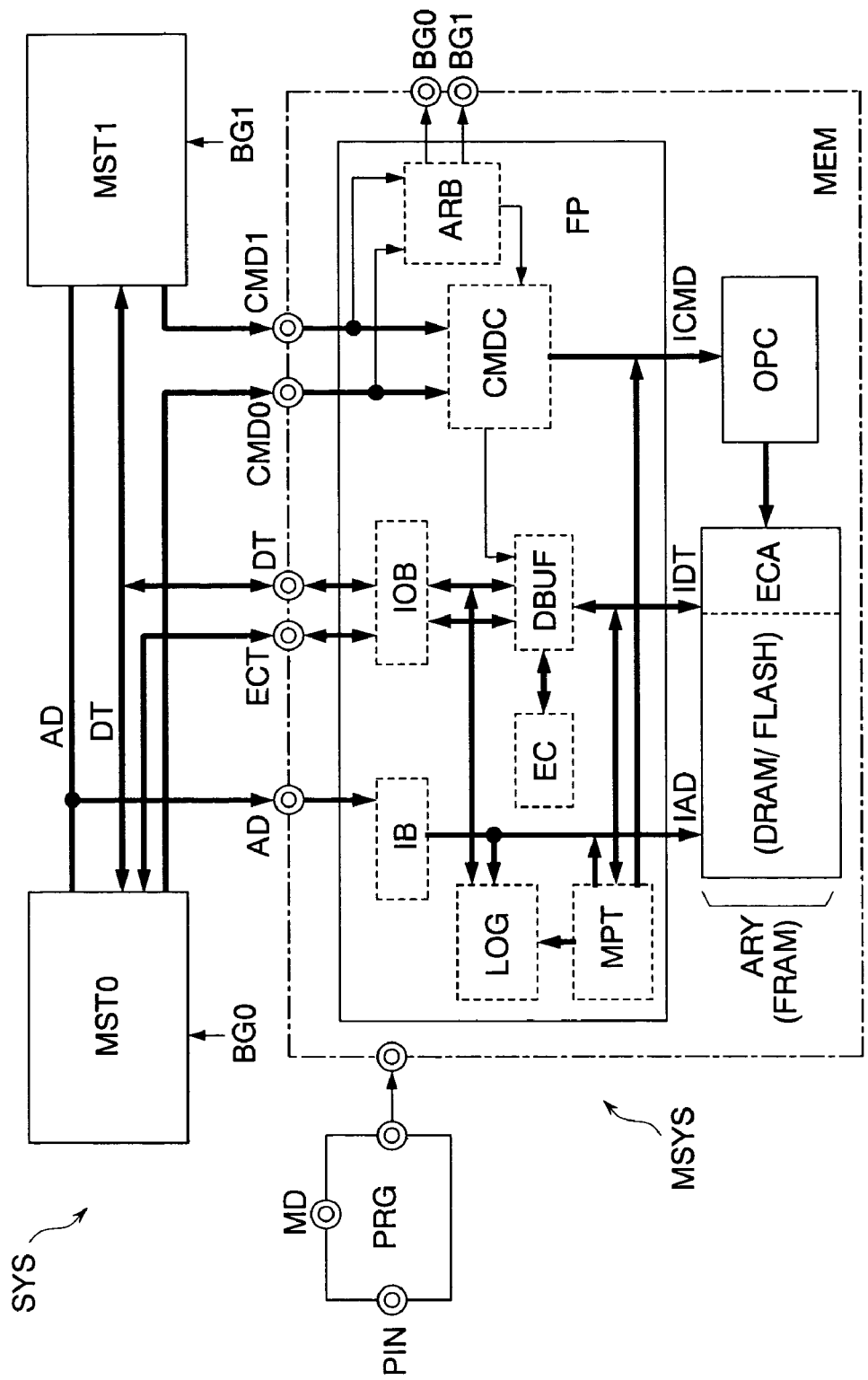
FIG. 12 is a block diagram showing a ninth embodiment of the invention.

FIG. 12 shows a ninth embodiment of memory system of the present invention. Like reference numerals are attached to the same components as those described in the first, third, fifth, and seventh embodiments, and the detailed descriptions thereof will be omitted. In the present embodiment, it is configured so that a function which automatically error-corrects the data stored in the memory array cell ARY is added to the memory MEM of the seventh embodiment. The other constructions are the same as those of the seventh embodiment (FIG. 10). That is, the master controller MST0 accesses the memory MEM as DRAM. The master controller MST1 accesses the memory MEM as NAND-type flash memory FLASH. The memory MEM has the memory cell array ARY of FRAM, and shares an area accessed as DRAM and an area accessed as FLASH.

The field programmable unit FP is configured so that a memory patrol unit MPT and a log unit LOG are added to the field programmable unit FP of the seventh embodiment. When the memory cell array ARY is in a non-access state (a standby state where it does not receive an access command), the memory patrol unit MPT sequentially accesses the memory cell array ARY so as to read data and error correction codes. After correcting an error by using the error code conversion unit EC, the memory patrol unit MPT rewrites the corrected data and a newly-generated error correction code into the memory cell array ARY. Accordingly, the data destroyed by noise or the like can be automatically recovered. When there is no error, rewriting is not performed. When there is an uncorrectable error, the memory patrol unit MPT writes the address, in which the error has been generated, into the log unit LOG.

The masters MST0 and MST1 can read the error address written into the log unit LOG through the data line DT. In order to have this enabled, the memory MEM has a log read command as an access command. After recognizing a memory cell (error memory cell) which cannot be error-corrected, the masters MST0 and MST1 can avoid the memory cell so as to write data. Accordingly, it is possible to improve the reliability of the memory system. Moreover, the address in which a correctable error has been generated and the number of corrections may be written into the log unit LOG. In this case, it is possible to evaluate the reliability of the memory cell array ARY.

Even in the ninth embodiment, it is possible to obtain the same effect as those of the first, third, fifth, and seventh embodiments. Further, in the semiconductor memory which is shared by the plurality of controllers of which the error correction code systems are different from each other, data destroyed by softerror, noise or the like can be automatically recovered. As a result, it is possible to improve the reliability of the semiconductor memory.

Figure 13:
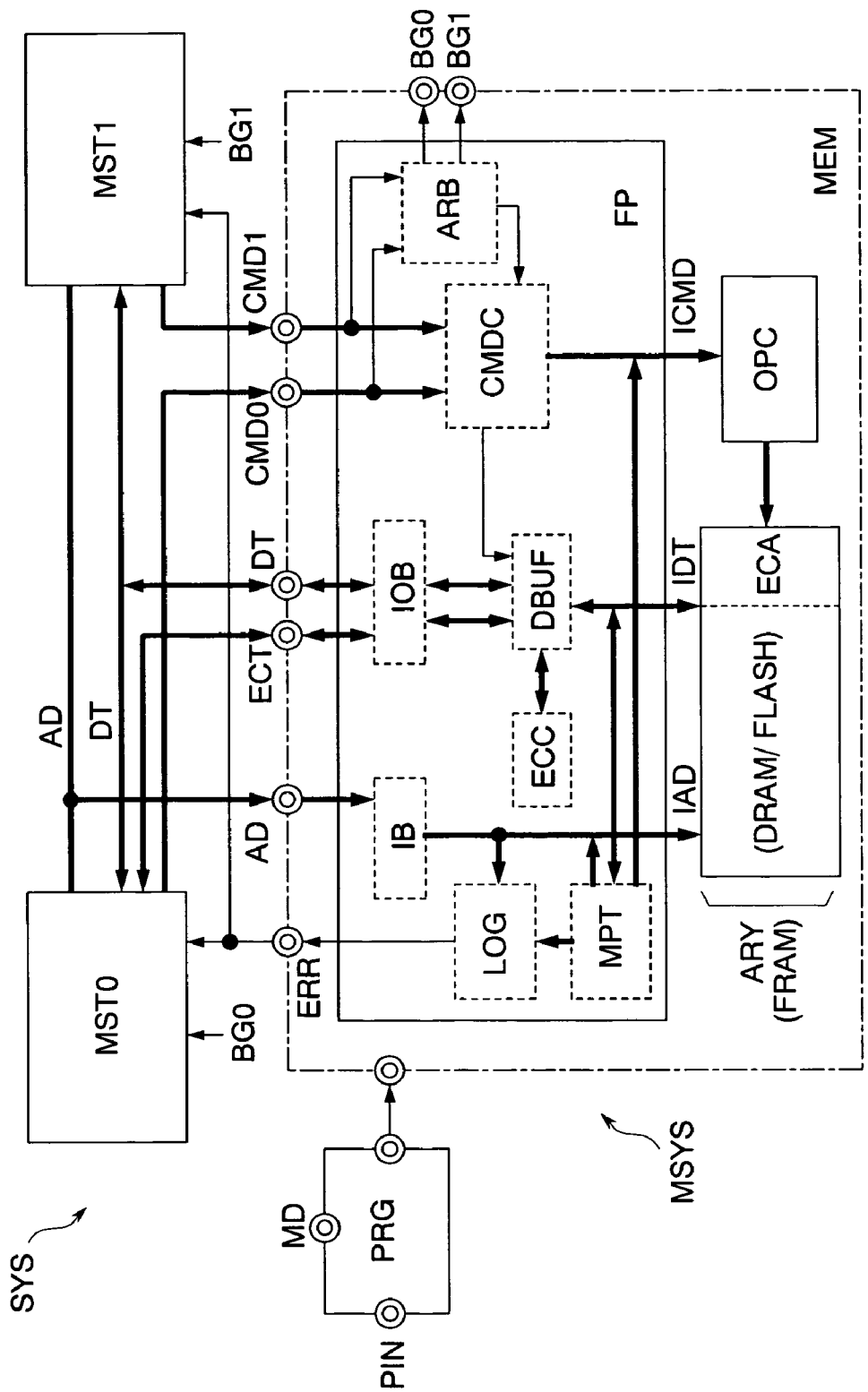
FIG. 13 is a block diagram showing a tenth embodiment of the invention.

FIG. 13 shows a tenth embodiment of memory system of the present invention. Like reference numerals are attached to the same components as those described in the first, third, fifth, seventh, and ninth embodiments, and the detailed descriptions thereof will be omitted. In the present embodiment, it is configured that an error terminal ERR outputting an error signal ERR is added to the memory MEM of the ninth embodiment. The other constructions are the same as those of the ninth embodiment (FIG. 12).

When holding an address AD, supplied from the masters MST0 and MST1 together with a read access request, as an uncorrectable error address, the log unit LOG outputs an error signal ERR. For example, when an error signal ERR, holding a low logic level while there is no error changes, into a high logic level, the masters MST0 and MST1 detect the generation of error.

When receiving an error signal ERR, at least any one of the masters MST0 and MST1 read the error address, which is held in the log unit LOG, through a log read command. For this reason, the masters MST0 and MST1 can recognize an address of the memory cell, which cannot be error-corrected, in synchronization with the detection of error which is performed by the memory patrol unit MPT. In other words, without accessing a memory cell which cannot be error-corrected, it is possible to recognize the existence of the memory cell. Therefore, it is possible to prevent the masters MST0 and MST1 from unnecessarily accessing the memory MEM and to improve the access efficiency.

Even in the tenth embodiment, it is possible to obtain the same effect as those of the first, third, fifth, seventh, and ninth embodiments. Further, the masters MST0 and MST1 can be prevented from unnecessarily accessing the memory MEM, so that the access efficiency can be improved.

Figure 14:
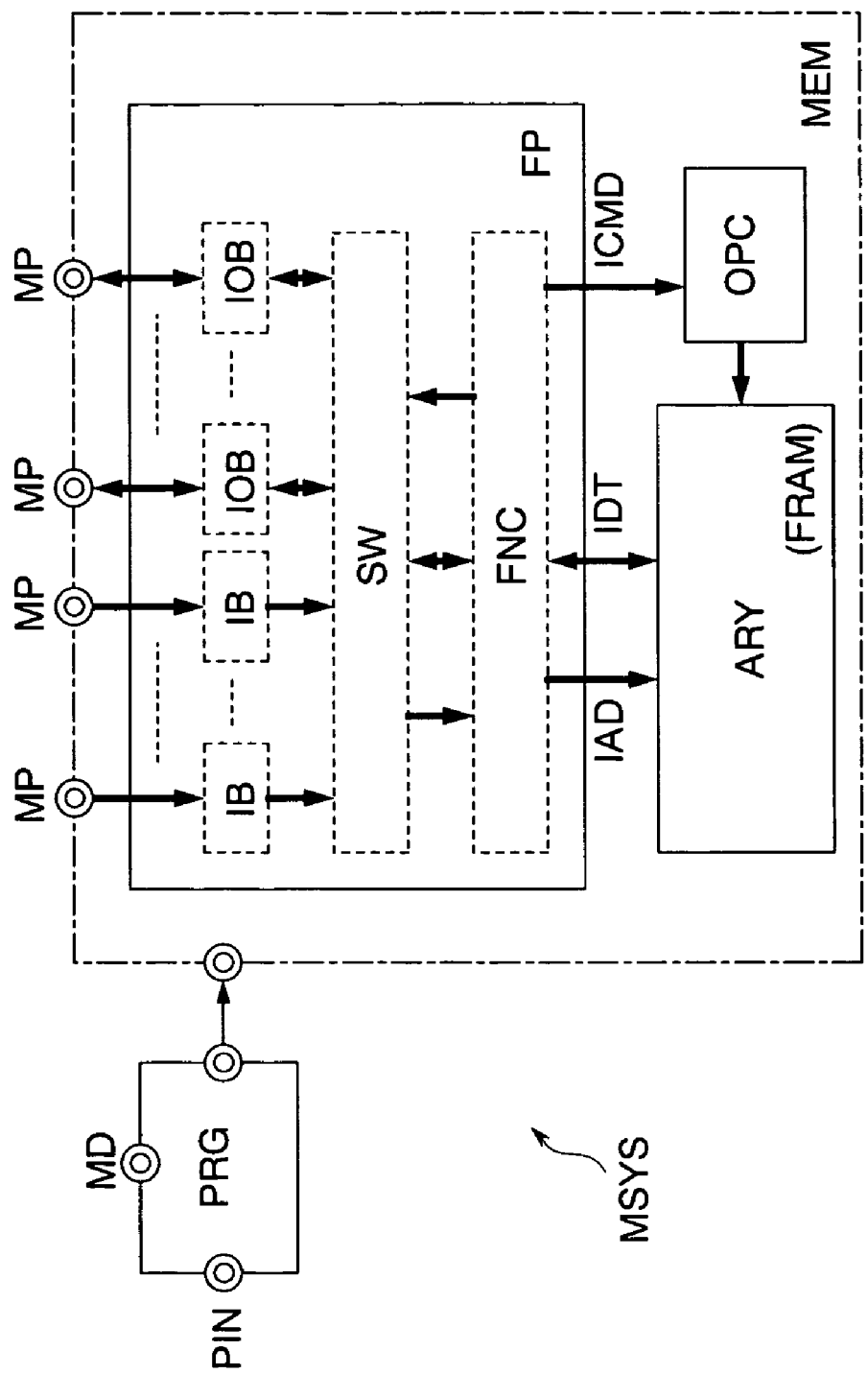
FIG. 14 is a block diagram showing an eleventh embodiment of the invention.

FIG. 14 shows an eleventh embodiment of memory system of the present invention. Like reference numerals are attached to the same components as those described in the first and third embodiments, and the detailed descriptions thereof will be omitted. In the present embodiment, the semiconductor memory MEM has a plurality of multipurpose terminals MR (ports). Some of the multipurpose terminals MP are connected to a switch unit SW through an input buffer IB. The remaining multipurpose terminals MP are connected to the switch unit SW through an input/output buffer IOB. The switch unit (signal switch unit) SW has a function of connecting the multipurpose terminals MP to a predetermined terminal of a functional unit FNC. The logic of the switch unit SW is formed in accordance with the program loaded in the program memory unit PRG.

The functional unit FNC outputs a signal supplied through the switch unit SW to the memory cell array ARY (FRAM) and the operation control circuit OPC, as an internal address signal IAD, an internal data signal IDT, or an internal command signal ICMD. The functional unit FNC outputs the internal data signal IDT, read from the memory cell array ARY, to the multipurpose terminal MP through the switch unit SW.

Figure 15:
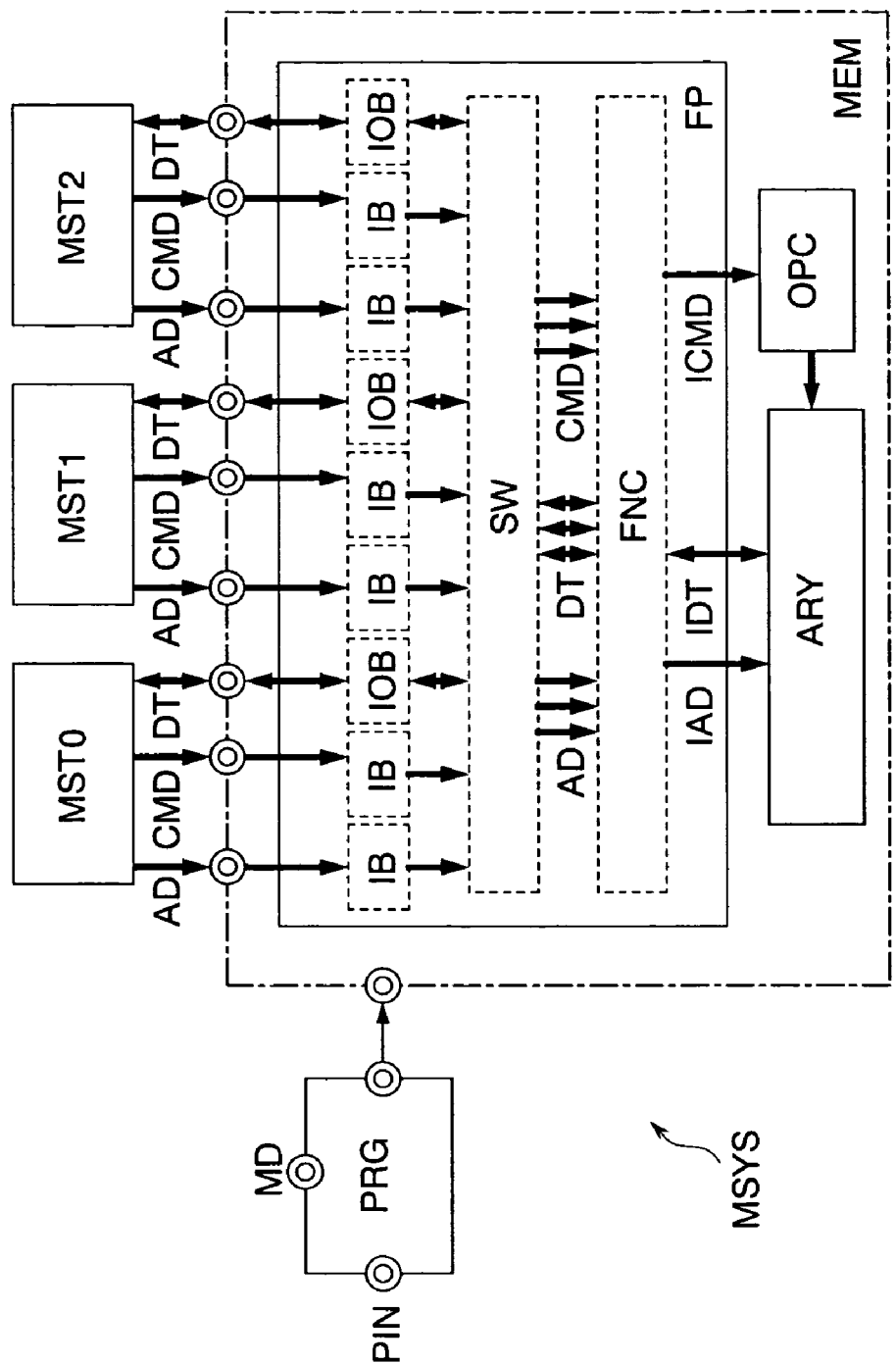
FIG. 15 is a block diagram showing an example where the memory shown in FIG. 14 is used.

FIG. 15 shows an example where the memory MEM shown in FIG. 14 is used. In this example, the system SYS (SIP) is formed by the memory MEM (chip), the program memory unit PRG (chip), and the master controllers MST0 to MST2 (chip) accessing the memory MEM. In this example, the masters MST0 to MST2 are respectively connected to the memory MEM through independent signal lines. The functional unit FNC sequentially receives an access request so as to execute an access operation to the memory cell array ARY.

Figure 16:
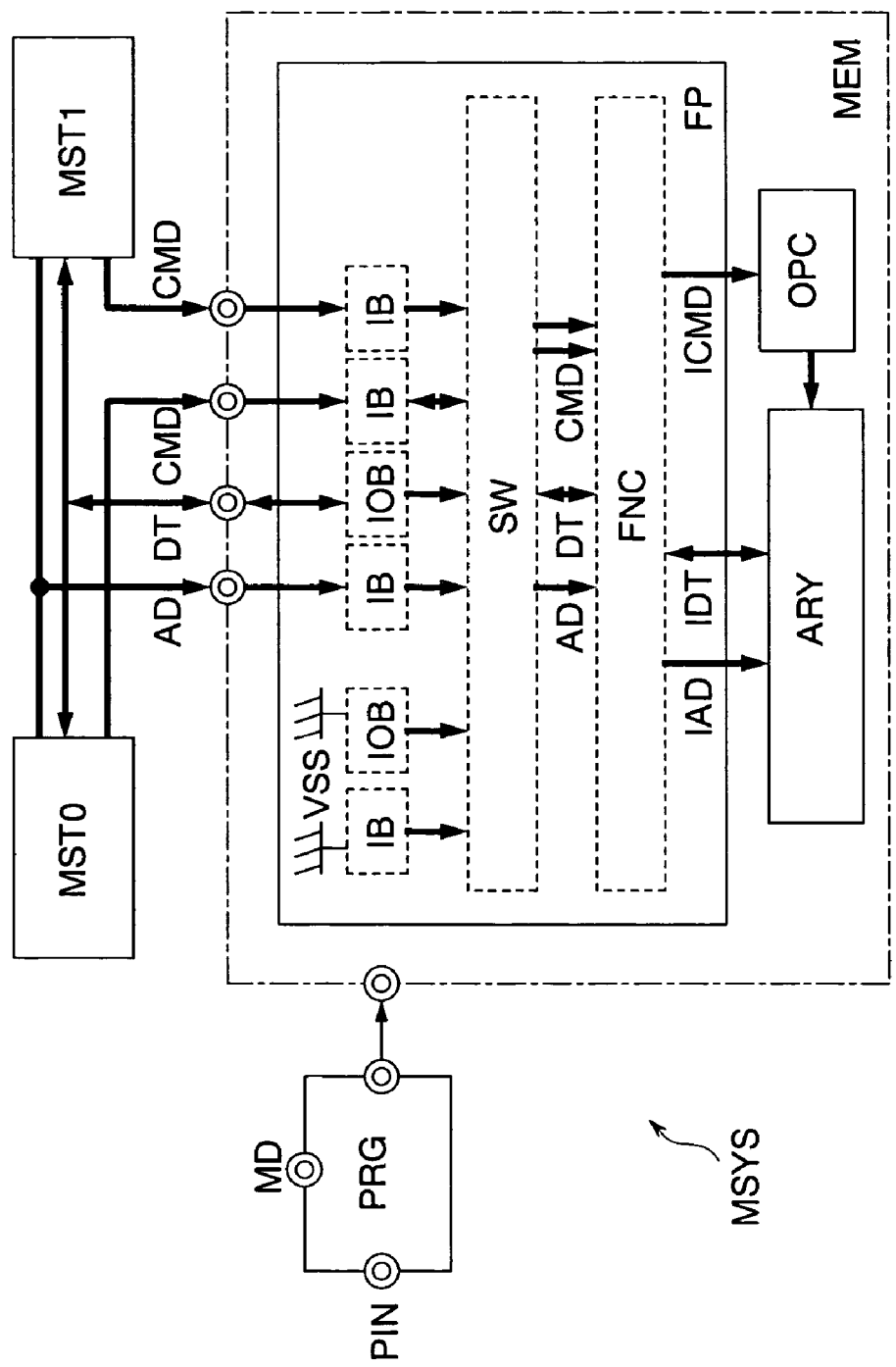
FIG. 16 is a block diagram showing another example where the memory shown in FIG. 14 is used.

FIG. 16 shows an example where the memory MEM shown in FIG. 14 is used. In this example, the master controllers MST0 and MST1 are connected to the memory MEM through the common external address signal line AD and the common external data line DT and the independent external command lines CMD. Such a construction can implement the third to fifth and seventh to tenth embodiments, for example.

Figure 17:
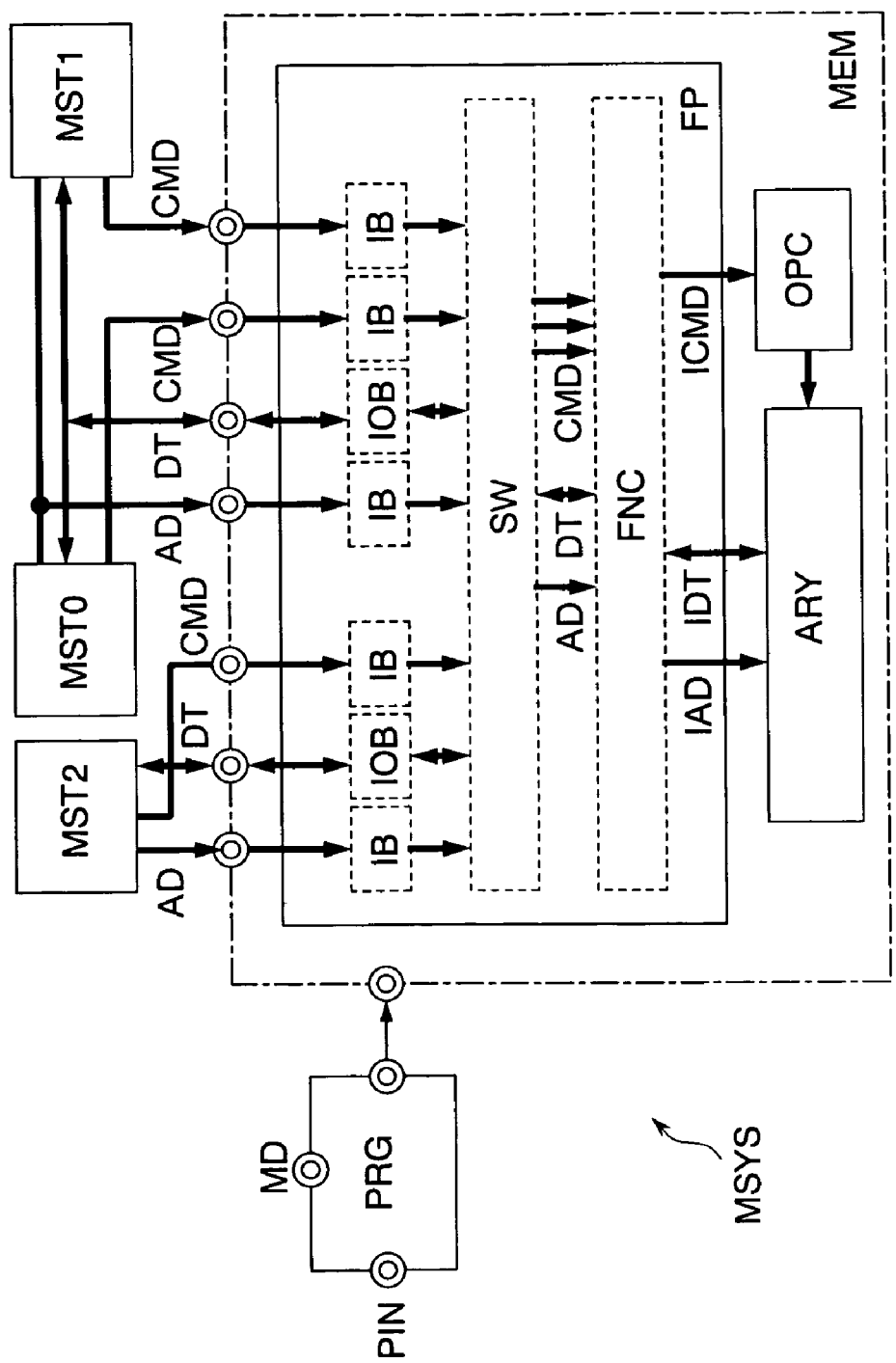
FIG. 17 is a block diagram showing a further example where the memory shown in FIG. 14 is used.

FIG. 17 shows an example where the memory MEM shown in FIG. 14 is used. In this example, the master controller MST2 and the memory MEM are connected to each other through an independent signal line, in addition to the above-described construction of FIG. 16. Such a construction can implement the sixth embodiment, for example.

Even in the eleventh embodiment, it is possible to obtain the same effect as those of the above-described embodiments. Further, an auxiliary external terminal of the memory MEM can be connected to a predetermined internal address signal line (IAD, a predetermined internal data signal line IDT, or a predetermined internal command signal line ICMD, through the switch unit SW. For this reason, one memory MEM can be adopted into the system SYS having various bus specifications.

Figure 18:
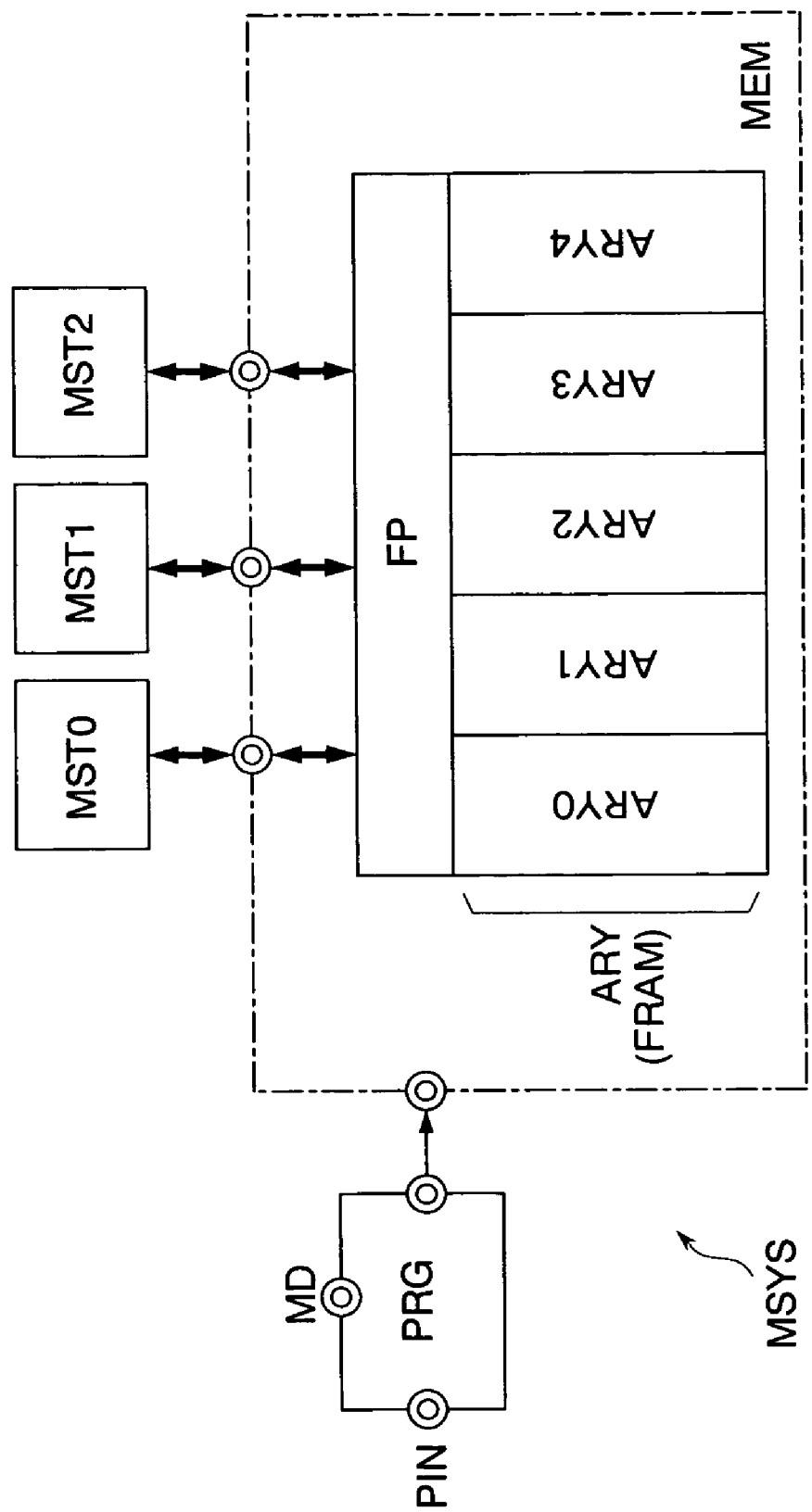
FIG. 18 is a block diagram showing a twelfth embodiment of the invention.

FIG. 18 shows a twelfth embodiment of memory system of the present invention. Like reference numerals are attached to the same components as those described in the first, third, and sixth embodiments, and the detailed descriptions thereof will be omitted. In the present embodiment, the memory cell array ARY is partitioned into five sub arrays ARY0 to ARY4 (memory areas) of which the access rights are different from each other. The other constructions are the same as those of the sixth embodiment (FIG. 8), except that the memory cell array ARY is accessed in common by the masters MST0 to MST2. The description of the operation control circuit OPC is omitted.

Figure 19:
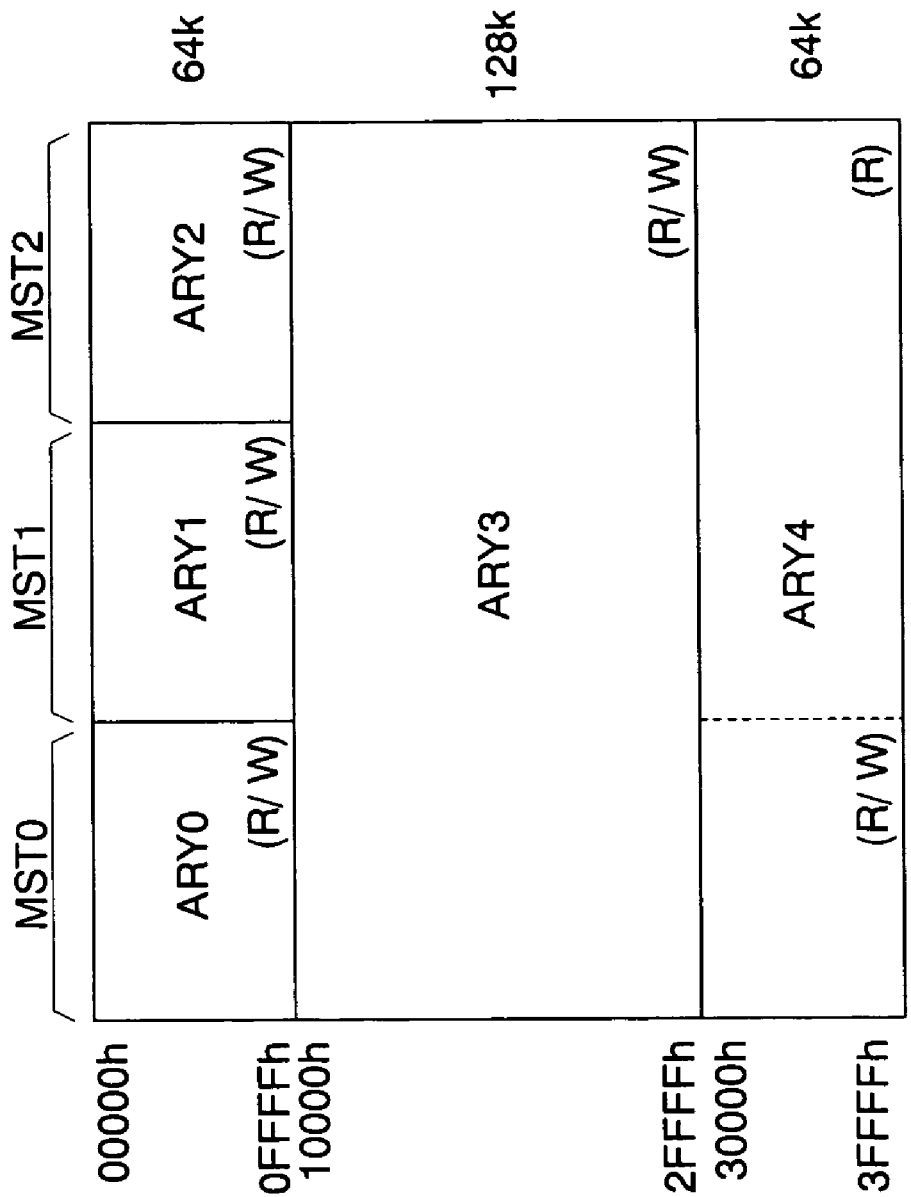
FIG. 19 is a diagram explaining a memory map of the memory cell array shown in FIG. 18.

FIG. 19 shows a memory map of the memory cell array ARY shown in FIG. 18. The sub arrays ARY0 to ARY2 are allocated to the same address space of 64 k word. The sub array ARY0 can be read and written (R/W) by the master MST0. The sub array ARY0 cannot be accessed by the masters MST1 and MST2. The sub array ARY1 can be read and written (R/W) by the master MST1. The sub array ARY1 cannot be accessed by the masters MST0 and MST2. The sub array ARY2 can be read and written (R/W) by the master MST2. The sub array ARY2 cannot be accessed by the masters MST0 and MST1.

The sub array ARY3 having an address space of 128 k word can be read and written by the masters MST0 to MST2. The sub array ARY4 having an address space of 64 k word can be read and written (R/W) by the master MST0. The sub array ARY4 can be only read (R) by the masters MST1 and MST2.

As such, in the present embodiment, the memory cell array ARY is partitioned into the plurality of sub arrays ARY0 to ARY4, in accordance with the program loaded on the program memory unit PRG. Further, the respective sub arrays ARY0 to ARY4 can be set to be shared by the plurality of masters MST or to be exclusively accessed by a predetermined master MST. In addition, it is possible to set the access rights (read/write permission, read permission, write prohibition, access prohibition or the like) of the respective sub arrays ARY0 to ARY4. The access right can be changed by updating the program memory unit PRG through the program input terminal PIN.

Even in the twelfth embodiment, it is possible to obtain the same effect as those of the above-described embodiments. Further, just developing one kind of semiconductor memory MEM can provide semiconductor memories having various access areas and access rights in accordance with the specification of a system on which the memory system MSYS is mounted.

Figure 20:
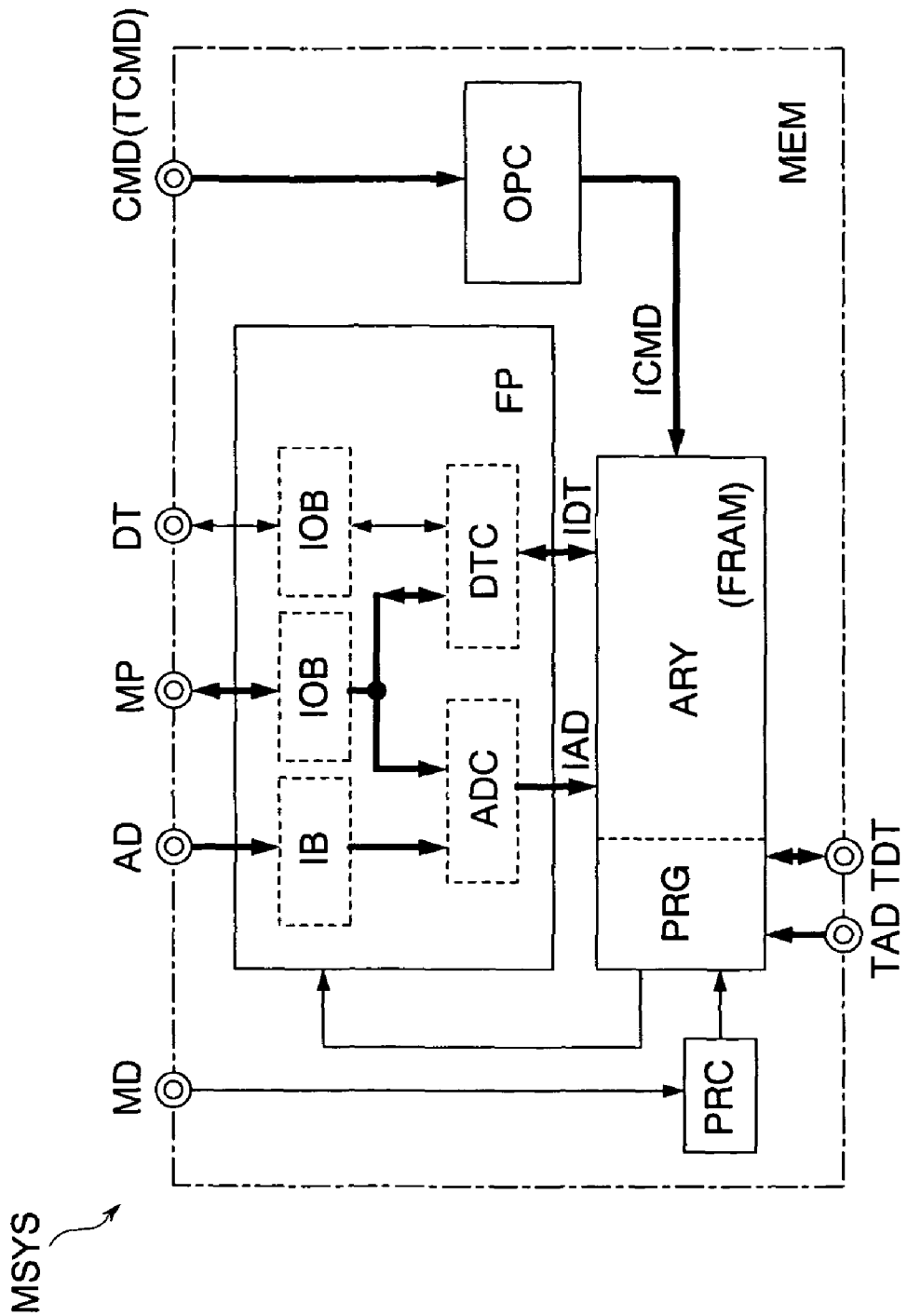
FIG. 20 is a block diagram showing a thirteenth embodiment of the invention.

FIG. 20 shows a thirteenth embodiment of memory system of the present invention. Like reference numerals are attached to the same components as those described in the first embodiment, and the detailed descriptions thereof will be omitted. In the present embodiment, the program memory unit PRG is formed inside the memory cell array ARY which has a nonvolatile memory cell and is composed of FRAM. The memory MEM has a test address terminal TAD and test data terminal TDT for writing a program for field programmable unit FP into the program memory unit PRG. The program input terminal PIN is not formed. The command terminal CMD is also used as a test command terminal TCMD which supplies a write command for writing a program into the program memory unit PRG. The program is written by a manufacturer of the memory MEM.

In order to program the logic of the field programmable unit FP, a program control unit PRC accesses the memory cell array ARY in accordance with a mode signal MD. Then, the program control unit PRC reads a program from a predetermined area of the program memory unit PRG. The update of the program written into the program memory unit PRG may be performed by using the test address terminal TAD and test data terminal TDT. Alternately, the update may be performed by using the address terminal AD and data terminal DT. The update can be performed during operation of the system.

Even in the thirteenth embodiment, it is possible to obtain the same effect as the above-described embodiments. Further, the program memory unit PRG is formed by using a portion of the memory cell array ARY, so that the program memory unit PRG and the memory MEM can be constructed by one chip. As a result, the construction of the memory system MSYS can be simplified, and a system cost can be reduced.

Figure 21:
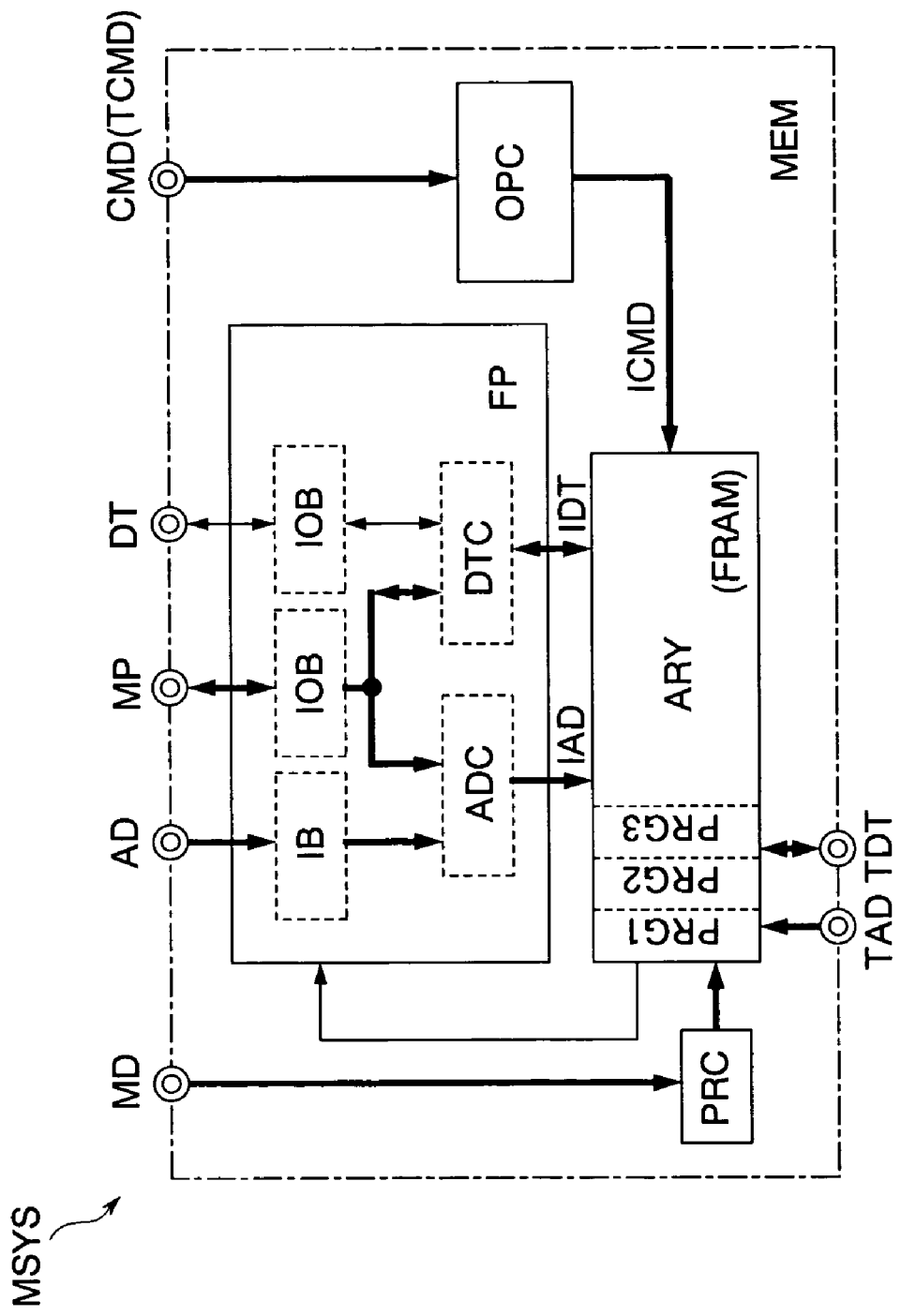
FIG. 21 is a block diagram showing a fourteenth embodiment of the invention.

FIG. 21 shows a fourteenth embodiment of memory system of the present invention. Like reference numerals are attached to the same components as those described in the first and thirteenth embodiments, and the detailed descriptions thereof will be omitted. In the present embodiment, the plurality of program memory units PRG1 to PRG3 are formed inside the memory cell array ARY. The program memory units PRG store programs different from each other. The programs are written by a manufacturer of the memory MEM.

In order to program the logic of the field programmable unit FP, the program control unit PRC accesses the memory cell array ARY in accordance with the mode signal MD of plural bits. Then, the program control unit PRC reads a program from any one of the program memory units PRG1 to PRG3. The operation specification and interface specification of the memory MEM are determined in accordance with the read program. The mode signal MD for selecting a program to be read is supplied by a memory controller (CPU) accessing the memory MEM or a system.

When the use of the memory MEM is previously determined, a fuse circuit may be formed instead of the mode terminal MD. In this case, a fuse is programmed in accordance with a fuse specification in a manufacturing process of the memory MEM.

Even in the fourteenth embodiment, it is possible to obtain the same effect as those of the above-described embodiments. Further, in accordance with the use of the memory MEM, the field programmable unit FP can be programmed into any one of plural kinds of functions, without a program being reloaded from outside.

Figure 22:
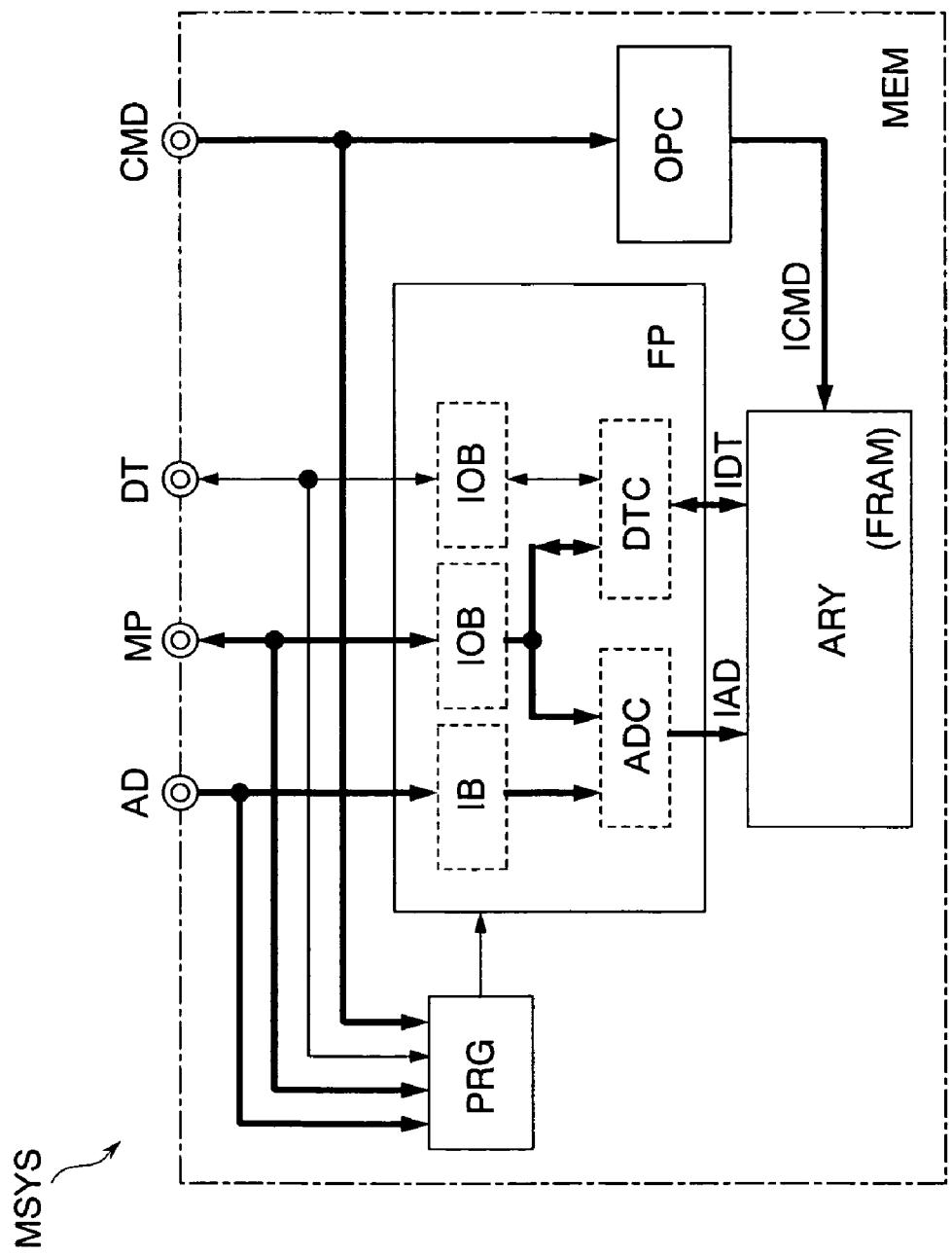
FIG. 22 is a block diagram showing a fifteenth embodiment of the invention.

FIG. 22 shows a fifteenth embodiment of memory system of the present invention. Like reference numerals are attached to the same components as those described in the first and thirteenth embodiments, and the detailed descriptions thereof will be omitted. In the present embodiment, the program memory unit PRG as well as the memory cell array ARY is allocated in the memory space. For this reason, the program memory unit PRG can be programmed by the command signal CMD, the address signal AD, and the data signal DT. In order to enlarge the bit width of the data signal DT, a portion of the multipurpose terminal MP is used as the data signal DT. Accordingly, the test address terminal TAD and test data terminal TDT of the thirteenth and fourteenth embodiments are not needed. Moreover, the program memory unit PRG may be programmed by setting a register space for program memory unit PRG and writing data into the register space.

Even in the fifteenth embodiment, it is possible to obtain the same effect as those of the above-described embodiments. Further, the program memory unit PRG is allocated in the memory space or register space, so that the number of terminals of the memory MEM can be lessened. As a result, the chip size of the memory MEM can be reduced.

Figure 23:
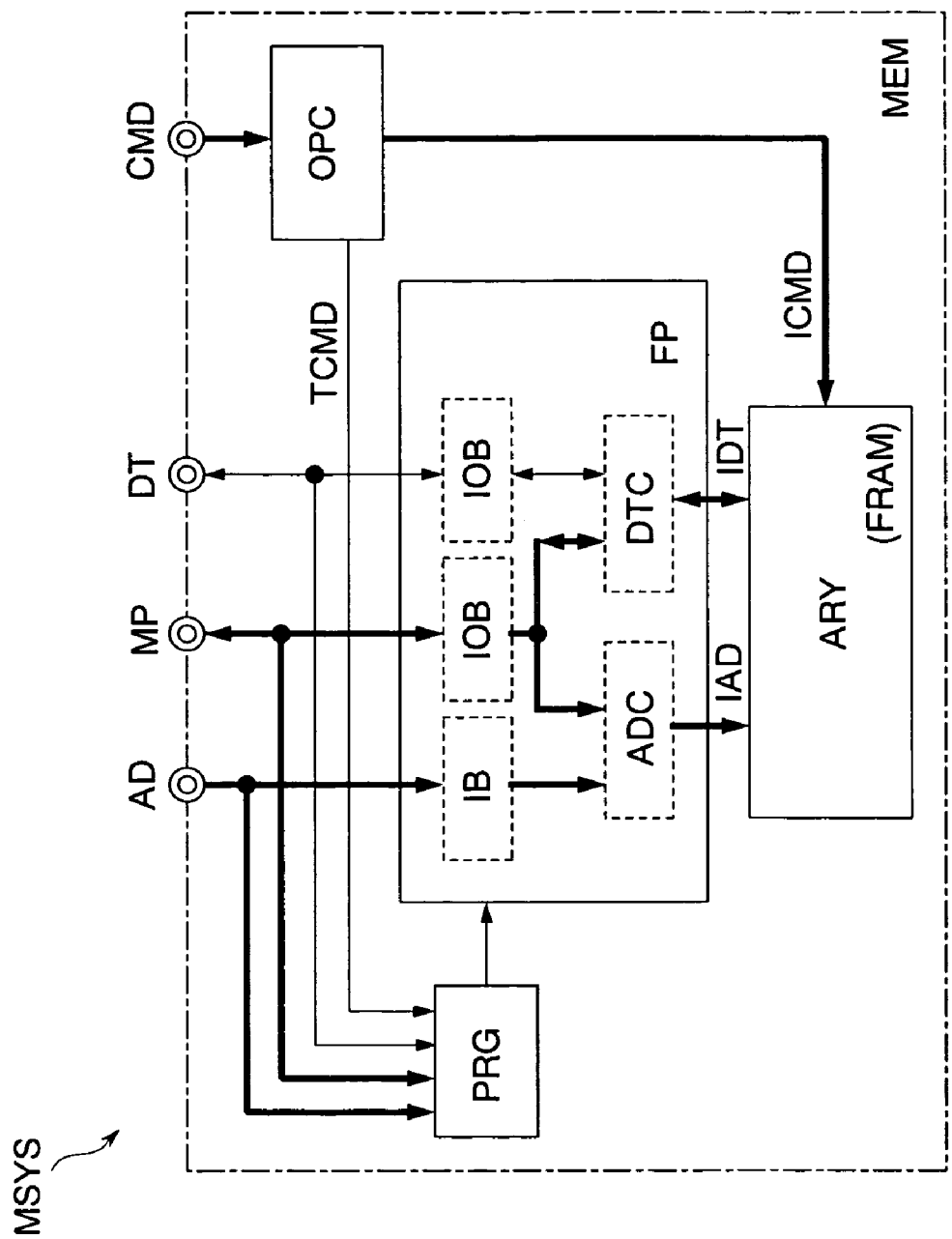
FIG. 23 is a block diagram showing a sixteenth embodiment of the invention.

FIG. 23 shows a sixteenth embodiment of memory system of the present invention. Like reference numerals are attached to the same components as those described in the first, thirteenth, and fifteenth embodiments, and the detailed descriptions thereof will be omitted. In the present embodiment, the data signal DT (MP) received together with the test command signal TCMD is programmed in the program memory unit PRG. The test command signal TCMD is supplied from a memory controller accessing the memory MEM or a system through a command terminal CMD. The address signal AD designates a position where data is written in the program memory unit PRG. Even in the sixteenth embodiment, it is possible to obtain the same effect as those of the above-described embodiments.

Figure 24:
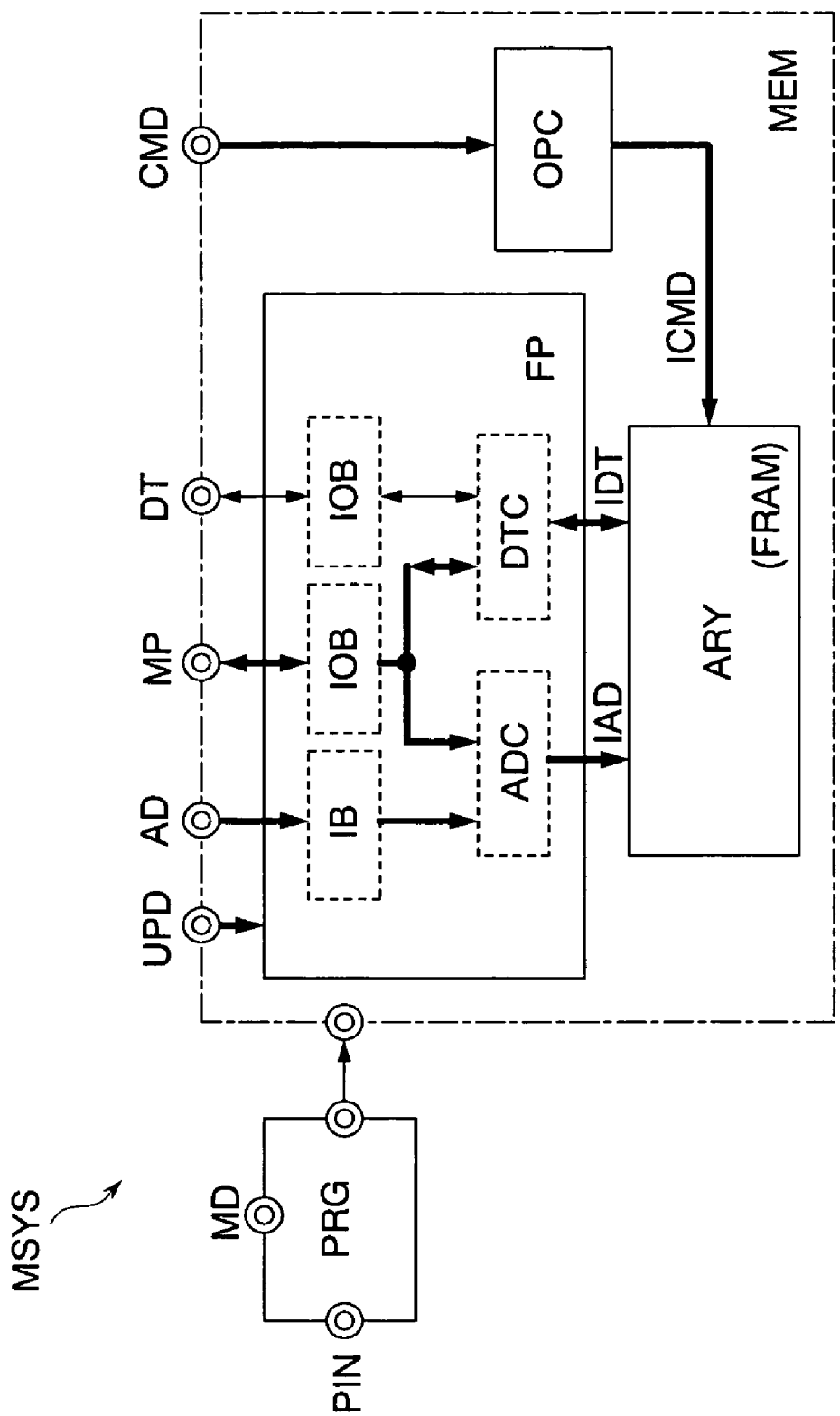
FIG. 24 is a block diagram showing a seventeenth embodiment of the invention.

FIG. 24 shows a seventeenth embodiment of memory system of the present invention. Like reference numerals are attached to the same components as those described in the first embodiment, and the detailed descriptions thereof will be omitted. In the present embodiment, the semiconductor memory MEM has an update terminal UPD. The other constructions are the same as those of the first embodiment. The update data constructing the logic of the field programmable unit FP is directly written into the field programmable unit FP through the update terminal UPD, not in the program memory unit PRG. That is, the logic of the field programmable unit FP can be changed during operation of the system on which the memory MEM is mounted. Even in the seventeenth embodiment, it is possible to obtain the same effect as those of the above-described embodiments. Further, with the update terminal being formed, the logic of the field programmable unit FP can be directly changed (updated) during operation of the system.

Moreover, the functions of the above-described embodiments can be combined with each other. For example, the error code conversion unit EC of the seventh embodiment (FIG. 10) may be formed in the eleventh embodiment (FIG. 14). Further, the memory patrol function of the eighth embodiment (FIG. 11) may be added.

The invention is not limited to the above embodiments and various modifications may be made without departing from the spirit and scope of the invention. Any improvement may be made in part or all of the components.

What is claimed is:

1. A memory system comprising:
 a semiconductor memory having a memory cell array with memory cells, the memory cell array being accessed using a first memory interface; and a field programmable unit in which logic to inter-convert external signals and internal signals is programmed, the internal signals being input/output to/from the memory cell array, the external signals being input/output to/from the memory system;
 a nonvolatile program memory unit storing therein a program for constructing the logic of the field programmable unit; and
 external command terminals that receive external command signals as the external signals, respectively, the external command terminals including second memory interfaces being different from the first memory interface and the external command signals indicating access requests for the memory cell array which are supplied from a plurality of controllers, wherein
 the internal signals include internal command signals for accessing the memory cell array;
 the second memory interfaces vary depending on the controllers; and
 the logic programmed in the field programmable unit has a command conversion unit which converts the external command signals received by the external command terminals into the internal command signals, and an arbiter which determines, when the external command signals compete with each other, an order in which the command conversion unit outputs the internal command signals in response to the external command signals.

2. The memory system according to claim 1, wherein the memory cell array is accessed in common by the controllers.

3. The memory system according to claim 1, wherein the memory cell array is partitioned into a plurality of memory areas which are accessed by the controllers, respectively.

4. A memory system comprising:
a semiconductor memory having a memory cell array with memory cells; and a field programmable unit in which logic to inter-convert external signals and internal signals is programmed, the internal signals being input/output to/from the memory cell array, the external signals being input/output to/from the memory system;
a nonvolatile program memory unit storing therein a program for constructing the logic of the field programmable unit; and
external command terminals that receive external command signals as the external signals, respectively, the external command signals indicating access requests for the memory cell array which are supplied from a plurality of controllers, wherein
the internal signals include internal command signals for accessing the memory cell array; and
the logic programmed in the field programmable unit has a command conversion unit which converts the external command signals received by the external command terminals into the internal command signals, and an arbiter which determines, when the external command signals compete with each other, an order in which the command conversion unit outputs the internal command signals in response to the external command signals, and wherein
the semiconductor memory includes priority terminals which receive priority signals from the controllers, respectively, the priority signals forcibly changing the output order determined by the arbiter.

5. A memory system comprising:
a semiconductor memory having a memory cell array with memory cells; and a field programmable unit in which logic to inter-convert external signals and internal signals is programmed, the internal signals being input/output to/from the memory cell array, the external signals being input/output to/from the memory system;
a nonvolatile program memory unit storing therein a program for constructing the logic of the field programmable unit;
a plurality of external terminals which are connected to a plurality of controllers and through which the external signals are input and output, the external terminals having error correction code systems for a data signal different from each other; and
an error code area which is formed in the memory cell array so as to store a main error correction code corresponding to a main controller among the controllers, wherein
the logic programmed in the field programmable unit has an error code conversion unit that converts a sub error correction code into the main error correction code to write it into the error code area, the sub error correction code being supplied from a sub controller among the controllers through the external terminals together with a data signal.

6. The memory system according to claim 5, wherein the error code conversion unit converts, into the sub error correction code, the main error correction code which is read from the memory cell array together with the data signal in accordance with the read access request from the sub controller, to output it to the sub controller through the external terminals.

7. The memory system according to claim 5, wherein the error code conversion unit has a function of detecting and correcting an error in the data signal from the error correction code supplied from the controllers through the external terminals in accordance with a write access request, and writes the error-corrected data signal and the main error correction code corresponding to the error-corrected data signal into the memory cell array.

8. The memory system according to claim 5, wherein the logic programmed in the field programmable unit has a memory patrol unit that reads the data signal from the memory cell array and the main error correction code corresponding to the data signal while the memory cell array is not accessed, corrects an error in the read data signal, and rewrites the corrected data signal and the main error correction code into the memory cell array.

9. The memory system according to claim 8, wherein the logic programmed in the field programmable unit has a log unit that stores an address signal indicating a memory cell storing the data signal error-corrected by the memory patrol unit.

10. The memory system according to claim 8, wherein the logic programmed in the field programmable unit has a log unit that stores a defect address signal indicating a memory cell storing an uncorrectable data signal detected by the memory patrol unit.

11. The memory system according to claim 10, further comprising an error terminal that outputs an error signal, wherein
the log unit outputs the error signal when an address signal supplied from each of the controllers together with a read access request is the defect address signal.

12. A memory system comprising:
a semiconductor memory having a memory cell array with memory cells; and a field programmable unit in which logic to inter-convert external signals and internal signals is programmed, the internal signals being input/output to/from the memory cell array, the external signals being input/output to/from the memory system;
a nonvolatile program memory unit storing therein a program for constructing the logic of the field programmable unit; and
a plurality of external terminals that are arbitrarily connected to a plurality of controllers and to which the external signals are supplied, wherein
the internal signals include an internal address signal indicating a memory cell to be accessed, an internal data signal written into the memory cell, and an internal command signal for accessing the memory cell array, and
the logic programmed in the field programmable unit has a signal switch unit which outputs the external signals supplied to the output terminals as any one of the internal address signal, the said internal data signal, and the internal command signal.

* * * * *